(12) United States Patent
Tsujimoto et al.

(10) Patent No.: US 6,238,515 B1
(45) Date of Patent: May 29, 2001

(54) WAFER TRANSFER APPARATUS

(75) Inventors: Masaki Tsujimoto, Urawa; Kenji Kobayashi, Oomiya; Hideo Numata; Keisuke Tokubuchi, both of Yokohama, all of (JP)

(73) Assignees: Lintec Corporation; Kabushiki Kaisha Toshiba, both of (JP)

( * ) Notice: Subject to any disclaimer, the term of this patent is extended or adjusted under 35 U.S.C. 154(b) by 0 days.

(21) Appl. No.: 09/376,996

(22) Filed: Aug. 18, 1999

(30) Foreign Application Priority Data

Aug. 18, 1998 (JP) .................................................. 10-231608

(51) Int. Cl.$^7$ .............................. H01L 21/78; H01L 21/30
(52) U.S. Cl. .................. 156/379.8; 156/540; 156/583.1; 156/584; 156/378; 156/249; 156/344; 438/464; 414/937; 414/941
(58) Field of Search .................................... 156/241, 249, 156/247, 344, 378, 350, 379.6, 379.8, 540, 583.1, 584; 438/464, 977; 414/935, 937, 941; 29/742, 743, 759, 760, 239

(56) References Cited

U.S. PATENT DOCUMENTS

| | | | | |
|---|---|---|---|---|
| 5,246,524 | * | 9/1993 | Kuroda et al. | 156/379.6 |
| 5,310,442 | * | 5/1994 | Ametani et al. | 156/584 |
| 5,888,883 | * | 3/1999 | Sasaki et al. | 438/464 |
| 6,030,485 | * | 2/2000 | Yamada | 156/584 |
| 6,083,811 | * | 7/2000 | Riding et al. | 438/464 |
| 6,149,758 | * | 11/2000 | Tsujimoto et al. | 156/584 |

FOREIGN PATENT DOCUMENTS 5-335411    12/1993 (JP) .

* cited by examiner

Primary Examiner—Michael W. Ball
Assistant Examiner—Michael A. Tolin
(74) Attorney, Agent, or Firm—Webb Ziesenheim Logsdon Orkin & Hanson, P.C.

(57) ABSTRACT

A wafer transfer apparatus for sticking a wafer, which is divided into a multiplicity of chips and which has its surface stuck with a protective tape, to a ring frame by a transfer tape, includes: a positioning unit capable of disposing the protective tape stuck wafer on a positioning table and capable of performing a position adjustment of the wafer in longitudinal, lateral and rotational directions, so that the wafer is located in a reference position; a transfer tape mount unit capable of disposing the protective tape stuck wafer, which has been located in the reference position by the positioning unit, on a transfer tape mount table, and capable of sticking a transfer tape to both a ring frame disposed round periphery of the wafer and back of the wafer, so that the wafer and the ring frame are stuck to each other and integrated; and a protective tape peeling unit capable of disposing the wafer, which has its back covered with the transfer tape and which has been integrated with the ring frame by the transfer tape mount unit, on a protective tape peeling table, and capable of bonding an end of a peeling tape to an end of the protective tape stuck to the wafer surface, and capable of pulling the peeling tape so that the protective tape is peeled from the wafer surface.

10 Claims, 25 Drawing Sheets

Fig. 12
(a)
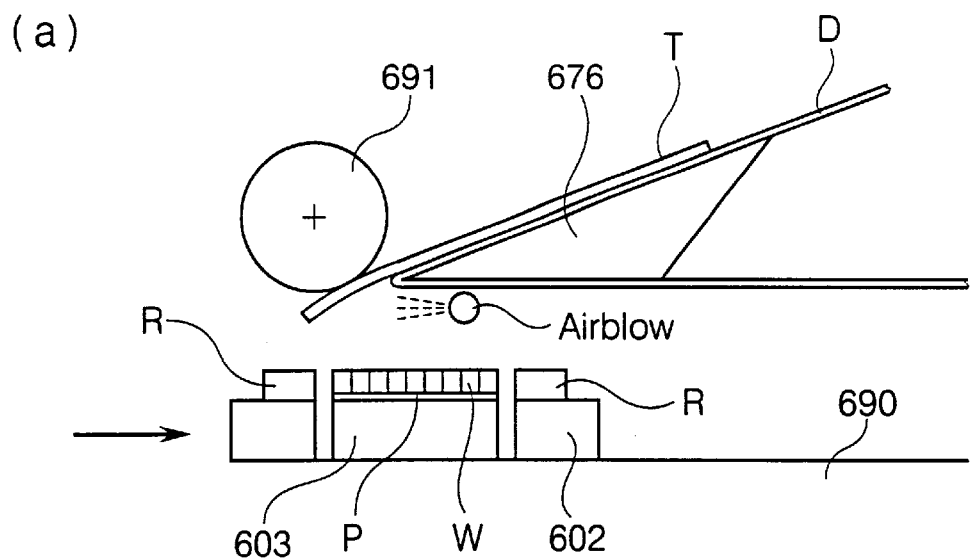
(b)
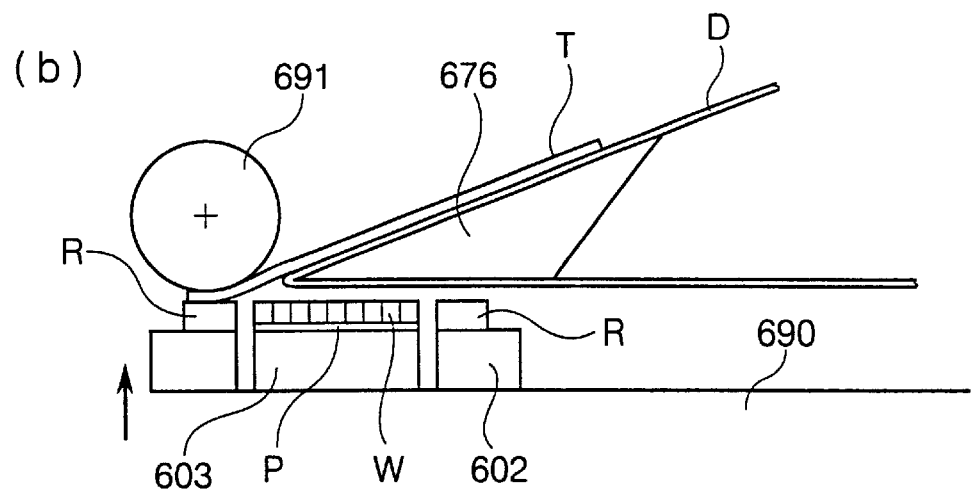
(c)
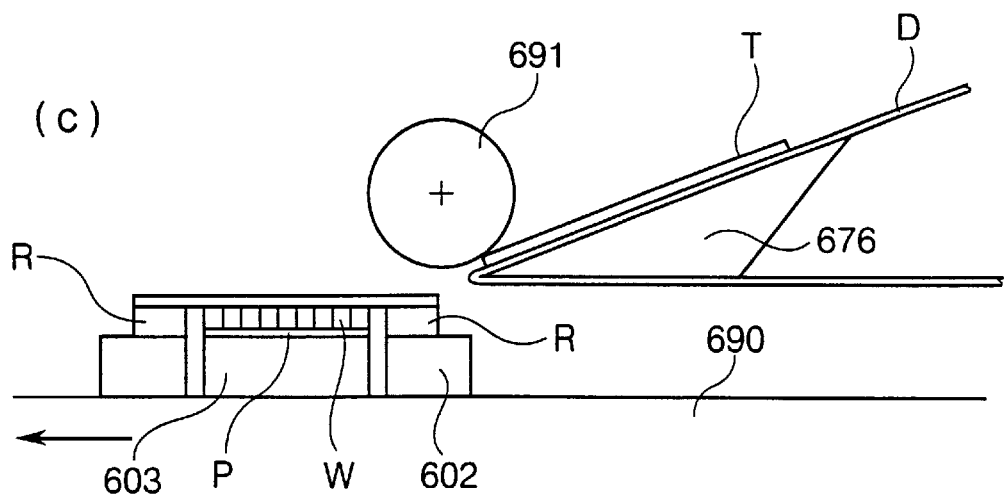

Fig. 16
(a)
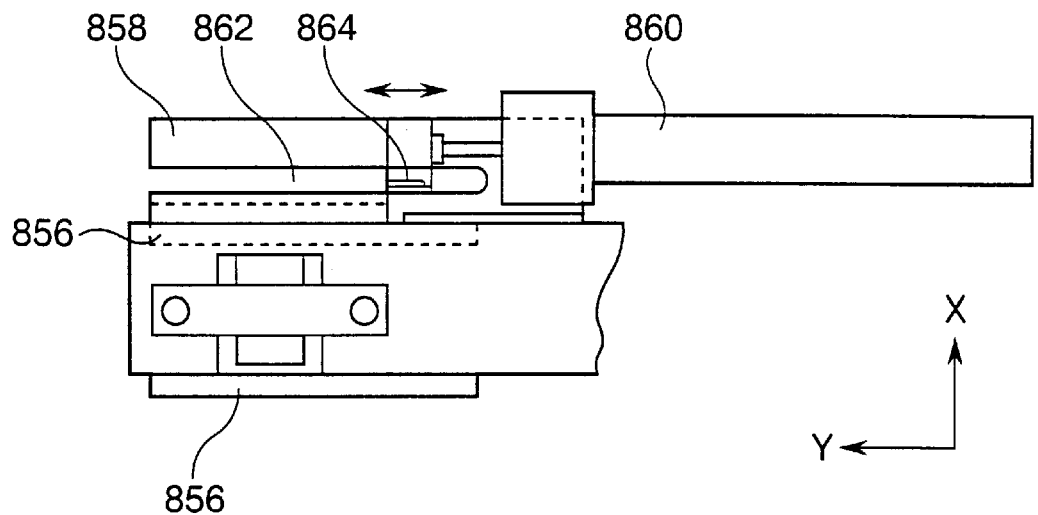
(b)
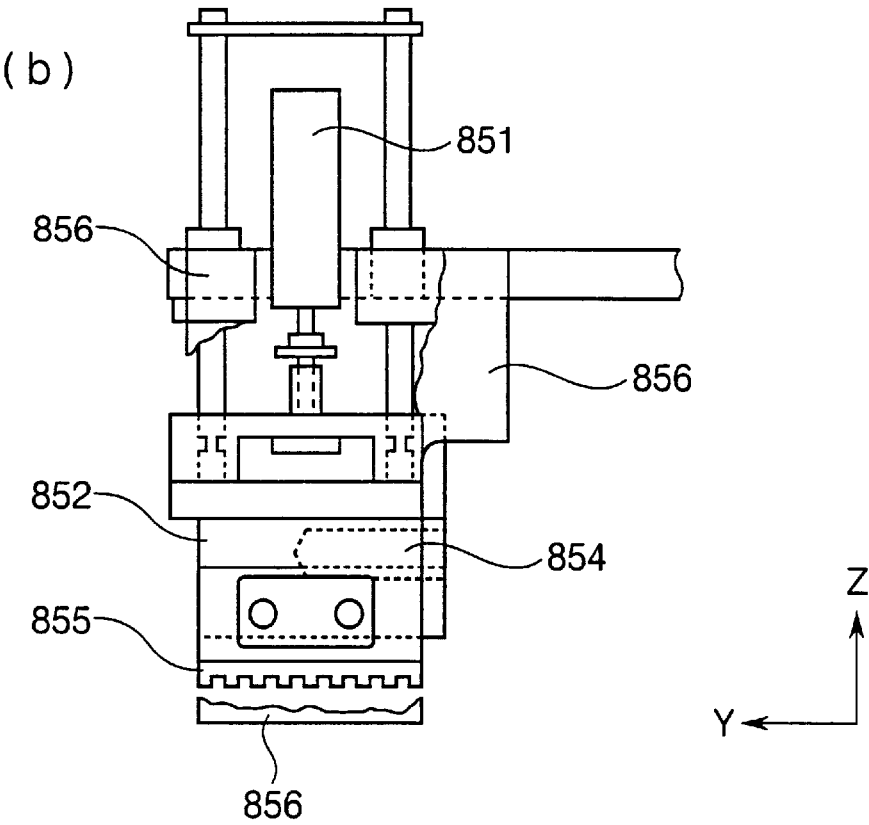

WAFER TRANSFER APPARATUS

FIELD OF THE INVENTION

The present invention relates to a wafer transfer apparatus capable of, in a process for manufacturing small electronic components such as semiconductor chips, transferring a wafer which has been subjected to dicing and back grinding and to which a protective tape has been stuck, to a ring frame and a transfer tape and peeling the protective tape from the wafer.

BACKGROUND OF THE INVENTION

In the conventional process for producing a wafer of, for example, a semiconductor such as silicon, a wafer is prepared in the form of a disk of large diameter and a circuit pattern is formed on a surface of the wafer. Thereafter, the circuit pattern surface is protected with a protective tape, and back of the wafer is ground. Further, the protective tape is peeled from the wafer surface. The thus obtained semiconductor wafer is held to a ring frame by means of a pressure sensitive adhesive sheet and diced (cut and divided into dice) so that a multiplicity of chips are obtained with the use of a dicing cutter. Thereafter, the chips in that state are subjected to subsequent cleaning, drying and die bonding steps.

Recently, the reduction of the thickness of semiconductor chips such as IC cards is increasingly demanded. The demand for semiconductor chips whose thickness is reduced to about 50 $\mu$m from the conventional 300 to 400 $\mu$m is increasing. However, when such extremely thin wafers are produced by the above back grinding process, there is the danger of carrying failure or wafer cracking caused by wafer warpage during, for example, protective tape peeling, wafer mounting and dicing steps.

The process known as "predicing" as disclosed in Japanese Patent Laid-open Publication No. 5(1993)-335411 has been proposed for coping with the above problem. In this process, a wafer is diced from its surface provided with a circuit to given depth in the direction of wafer thickness so that grooves with bottoms in a dice pattern are formed. Subsequently, a protective tape is stuck to the wafer surface, and the wafer back is ground to the grooves with bottoms so that the wafer is divided into a multiplicity of chips. Thereafter, the wafer covered with the protective tape is held to a ring frame and is subjected to subsequent cleaning, drying and die bonding steps.

However, in any of the above processes, the current situation is that peeling of a protective tape and sticking of a transfer tape to a wafer are carried out by separate devices. In this case, wafer must be carried between separate device, and this is generally performed by placing wafers in a container such as a wafer carrier provided with multi-stage wafer accommodation spaces and transporting the container to subsequent-step device.

Currently, the thickness of wafers tends to become smaller and, on the other hand, the diameter of wafers tends to become larger. The centers of the wafers sink and are deformed by their own weights in the carrier, depending on the ratio of wafer diameter to thickness. As a result, it is difficult to takeout automatically the wafer from the carrier and place it in the carrier. Even if automatic takeout and placing can be conducted, there is the danger of wafers contacting the carrier to thereby suffer from breakage and damaging.

In the predicing process, the wafers are in the state of being divided in a multiplicity of chips and fixed by a protective tape composed of a flexible film, so that, at the time of handling, there is the danger of neighboring chips contacting each other to thereby suffer from breakage.

The present invention provides a wafer transfer apparatus in which a wafer having been divided into a multiplicity of chips by predicing and covered with a protective tape can be transferred continuously and automatically to a transfer tape and a ring frame and the protective tape can be peeled, so that it can be accommodated in a carrier. As a result, wafer transfer apparatus of this invention can prevent cracking caused by the carrying of a thin wafer (chips), breakage and cracking caused by the carrying conducted between devices by means of carriers, etc., and wafer (chips) cracking caused by takeout from the inside of carriers.

SUMMARY OF THE INVENTION

The present invention has been made with a view toward resolving the drawbacks of the prior art and attaining the above object. According to the present invention, there is provided a wafer transfer apparatus for holding a wafer, which is divided into a multiplicity of chips and which surface is stuck with a protective tape, to a ring frame by means of a transfer tape, comprising:

a positioning unit capable of disposing the protective tape stuck wafer on a positioning table and capable of performing a position adjustment of the wafer in longitudinal, lateral and rotational directions, so that the wafer is located in a reference position;

a transfer tape mount unit capable of disposing the protective tape stuck wafer, which has been located in the reference position by the positioning unit, on a transfer tape mount table, and capable of sticking a transfer tape to both a ring frame disposed round periphery of the wafer and back of the wafer, so that the wafer and the ring frame are stuck to each other and integrated; and a protective tape peeling unit capable of disposing the wafer which has its back covered with the transfer tape and which has been integrated with the ring frame by the transfer tape mount unit, on a protective tape peeling table, and capable of bonding an end of a peeling tape to an end of the protective tape stuck to the wafer surface, and capable of pulling the peeling tape so that the protective tape is peeled from the wafer surface.

By virtue of this construction, chipped wafer division lines are recognized, and a position adjustment is conducted in longitudinal and lateral directions (XY-directions) and rotational direction ($\theta$-direction) so that the wafer is located in a reference position. As a result, accurate die bonding in the die bonding step can be performed. Moreover, the transfer operation and the protective tape peeling operation can be continuously performed without the need to carry by the use of wafer carriers. Therefore, wafer breakage, damaging and cracking can be prevented.

In the wafer transfer apparatus of the present invention, preferably, the protective tape is one having an ultraviolet curable pressure sensitive adhesive, and the wafer transfer apparatus further comprises an ultraviolet irradiating unit capable of irradiating the protective tape with ultraviolet light prior to the peeling of the protective tape from the wafer surface by the protective tape peeling unit.

In the present invention, the ultraviolet irradiating unit is preferably arranged so that the ultraviolet irradiation precedes the sticking of the transfer tape to the wafer.

The radiation curable pressure sensitive adhesive is used in the adhesive of the protective tape and is irradiated with ultraviolet light so that the adhesive strength of the protective tape can be reduced and the protective tape can be easily peeled from the wafer divided into chips in the protective tape peeling step.

Furthermore, in the wafer transfer apparatus of the present invention, it is preferred that the transfer tape is one having an ultraviolet curable pressure sensitive adhesive, and that the wafer transfer apparatus further comprise an ultraviolet irradiating unit capable of irradiating the transfer tape with ultraviolet light after the wafer and the ring frame are stuck to each other by means of the transfer tape.

The radiation curable pressure sensitive adhesive is used in the adhesive of the transfer tape and is irradiated with ultraviolet light so that the pickup adhesive strength of the transfer tape can be reduced and the pickup can be easily performed at the time of picking up the chips from a surface of the transfer tape in the die bonding step.

Moreover, the wafer transfer apparatus of the present invention preferably further comprises an accommodation unit fitted with a frame cassette for accommodating the wafer, which is integrated with the ring frame and which has the protective tape removed from the wafer surface by the protective tape peeling unit.

In the present invention, preferably, the peeling tape used in the protective tape peeling unit is a heat sensitive adhesive tape, and the wafer transfer apparatus is so constructed that an end of the peeling tape is bonded by heat melting to an end of the protective tape stuck to the wafer surface, and that the peeling tape is pulled to thereby enable peeling of the protective tape from the wafer surface.

By virtue of this construction, since the peeling tape is not bonded to the transfer tape for the ring frame at the time of peeling the protective tape, peeling operation efficiency is enhanced.

In the present invention, the wafer transfer apparatus still preferably further comprises means for carrying the wafer between the individual units, the carrying means being so constructed as to carry the wafer while all surface (an entire area of surface) of the wafer is attracted thereto by suction.

Thus, any localized load on the wafer, accordingly breaking and cracking of the wafer, can be prevented by attracting all surface of the wafer by suction.

BRIEF DESCRIPTION OF THE DRAWING

FIG. 12(a), 12(b) and 12(c) are schematic views for explaining the motion and function of a transfer tape mount unit included in the wafer transfer apparatus of the present invention;

FIG. 16(a) and 16(b) are enlarged views of a heater cutter portion included in the protective tape peeling unit for use in the present invention;

DETAILED DESCRIPTION OF THE INVENTION

One form (example) of wafer transfer apparatus according to the present invention will be described below with reference to the appended drawings.

Figure 1:
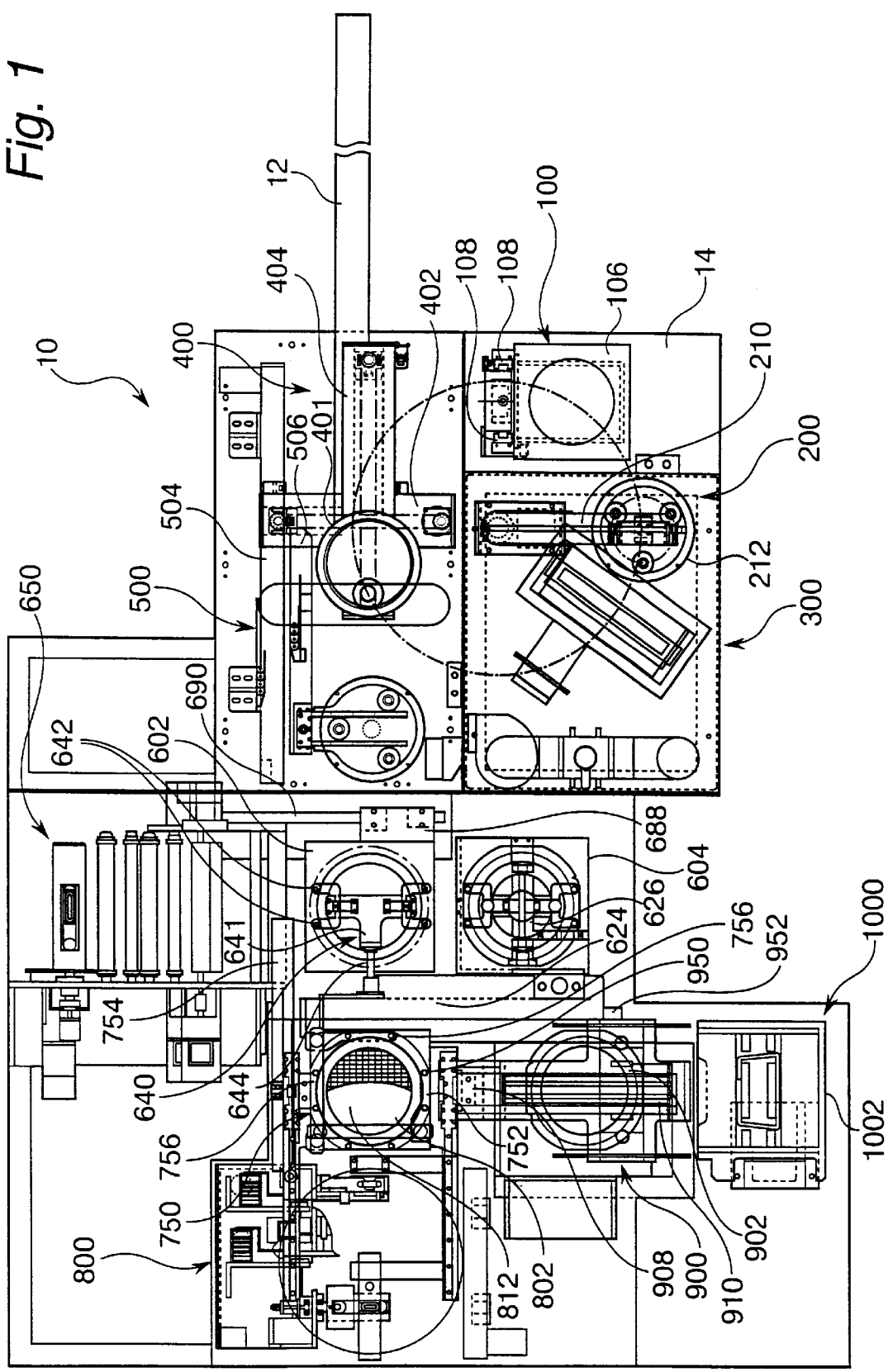
FIG. 1 is a top view of the entire body of one form of wafer transfer apparatus according to the present invention.

Referring to FIG. 1, numeral 10 generally denotes a wafer transfer apparatus of the present invention. The wafer transfer apparatus 10 processes a wafer divided into a multiplicity of chips and furnished with a protective tape stuck thereto (hereinafter, the wafer divided into a multiplicity of chips which are fixed in wafer form by means of a protective tape is referred to as "wafer W") . This wafer W can be obtained by, in accordance with the above predicing process. Namely, a wafer is diced from its surface finish with a circuit to a given depth in the direction of wafer thickness so that grooves are formed with bottoms in a dice pattern. Subsequently, a protective tape is stuck to the wafer surface and the wafer back is ground to the grooves with bottoms so that the wafer is divided into a multiplicity of chips.

Figure 2:
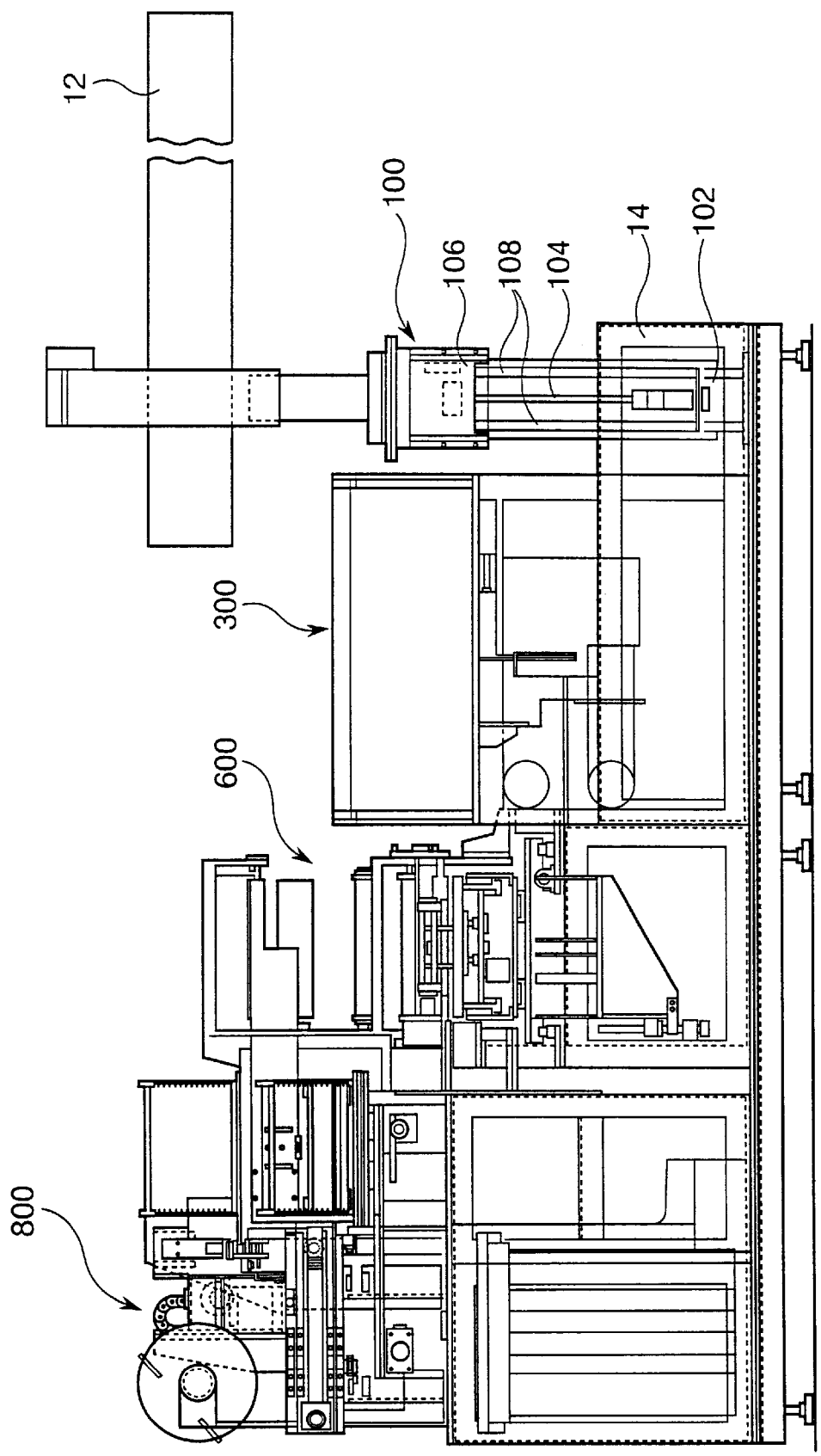
FIG. 2 is a front view of the wafer transfer apparatus shown in FIG. 1.
Figure 3:
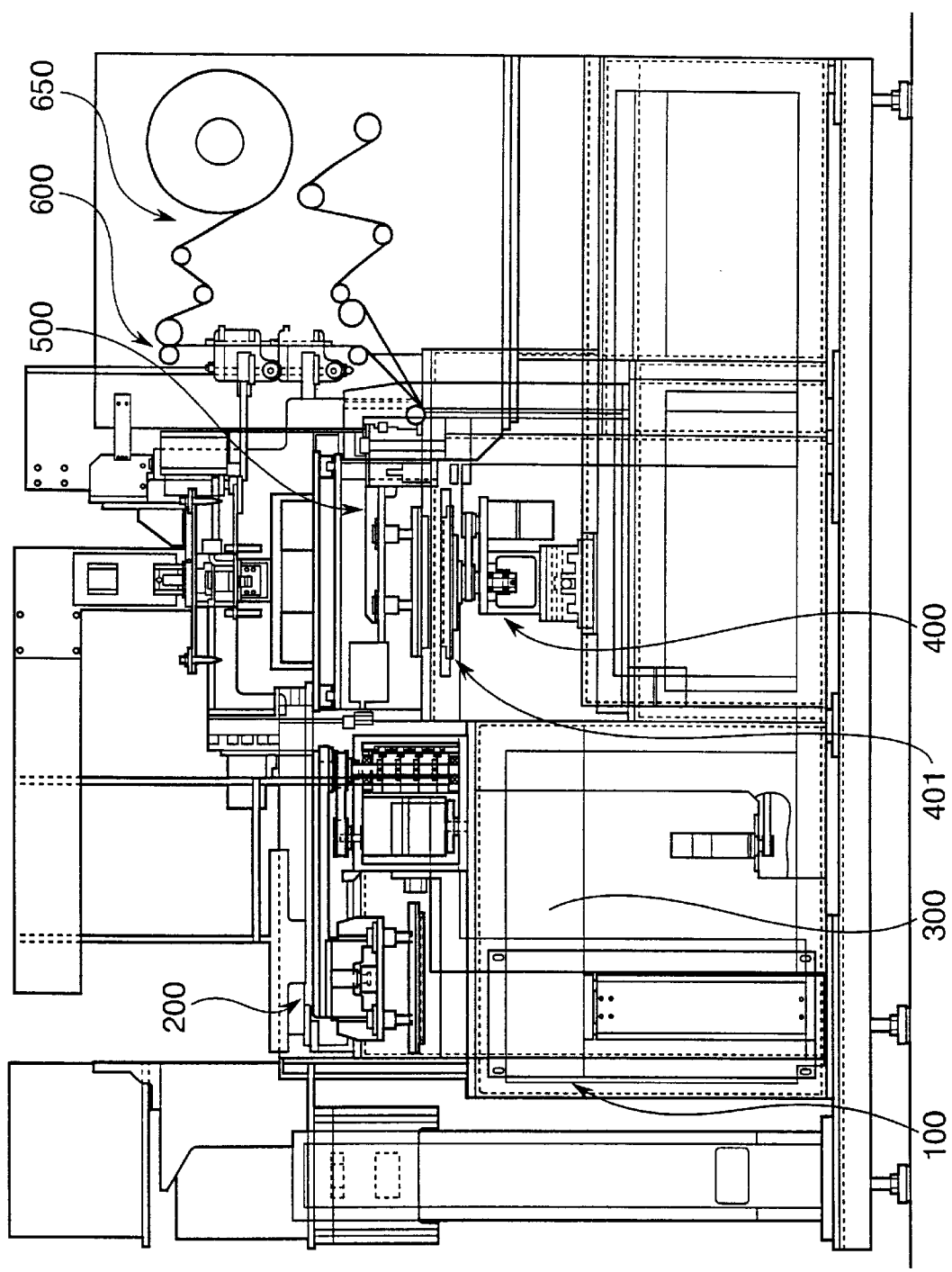
FIG. 3 is a right side view of the wafer transfer apparatus shown in FIG. 1.

The above processed wafer W covered with the protective tape, after the back grinding conducted by a separate back grinder not shown, is moved and disposed on wafer delivery table 100 fitted on base 14 of the wafer transfer apparatus 10 by means of carrying arm 12 so that protective tape P side of the wafer W constitutes a lower side. This delivery table 100 is so constructed that, referring to FIG. 2, the rotation of a motor not shown is transmitted by a belt to pulley 102 to thereby rotate ball screw 104 coupled with the pulley 102. As a result, delivery table base 106 connected to the ball screw 104 can be vertically moved along guide rail 108. By virtue of this construction permitting vertical movement, the delivery table base 106 is vertically moved synchronously with the vertical movement of the suction part of the carrying arm 12. At the time of the delivery of the wafer W, which is held at suction part (not shown) of the carrying arm 12 by suction, to the delivery table base 106, the breakage of the wafer W can be prevented.

The delivery table base 106 of the delivery table 100 may be composed of a suction member like the below described suction part 214 of suction carrying member 216.

Furthermore, in place of providing the delivery table 100 for wafer W, it may be implemented to use an accommodation container for wafer W as a placement base on which the container can be disposed. The wafer W. which was processed through the back grinding step, is housed in the accommodation container and the wafer W is taken out batchwise so that further processing can be effected.

The wafer W having been moved and disposed on the delivery table 100 is conveyed to ultraviolet (UV) irradiation unit 300 by means of wafer carrying unit 200.

Figure 4:
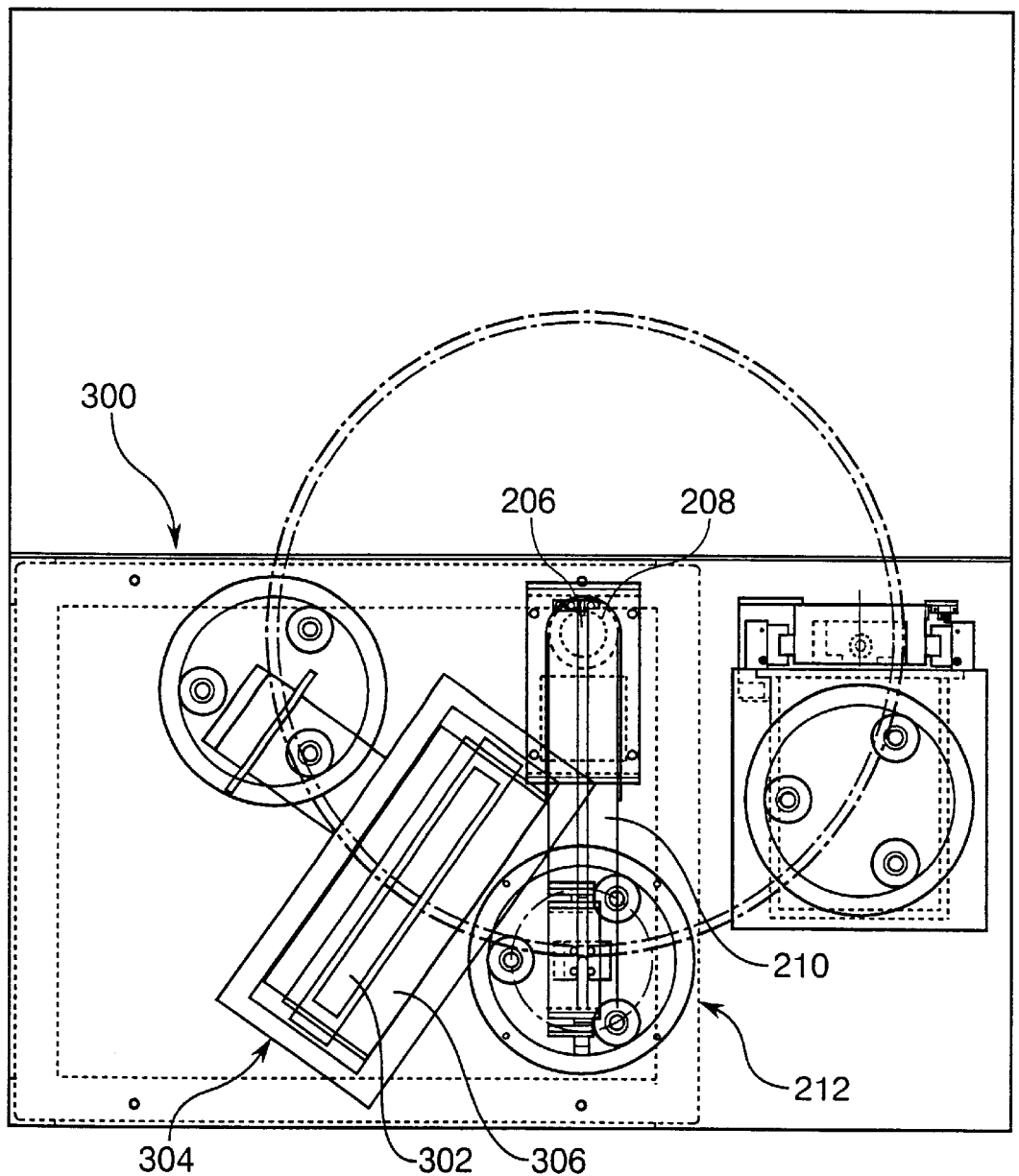
FIG. 4 is a top view of a wafer carrying unit and an ultraviolet irradiation unit included in the wafer transfer apparatus of the present invention.
Figure 5:
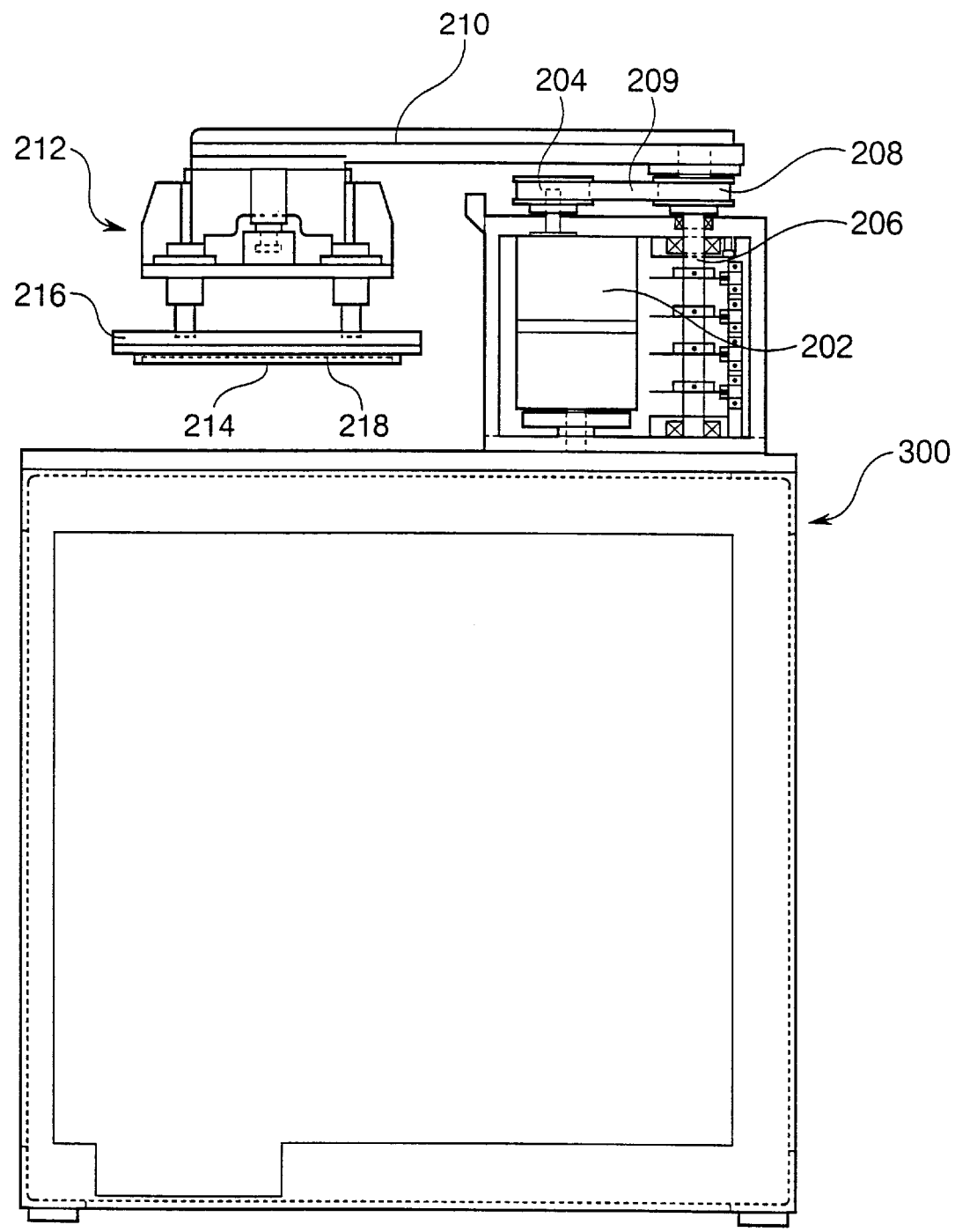
FIG. 5 is a side view of the wafer carrying unit and ultraviolet irradiation unit shown in FIG. 4.

The wafer carrying unit 200 is so constructed that, referring to FIGS. 4 and 5, the rotation of the driving shaft of drive motor 202 is transmitted to rotary shaft 206 by means of belt 209 passing over the rims of pulley 204 coupled with the driving shaft and pulley 208 fixed to the rotary shaft 206. As a result, carrying arm 210 coupled with the rotary shaft 206 makes a circular arc rotation around the rotary shaft 206 as shown by dashed lines in FIG. 4. An end portion of the carrying arm 210 is fitted with suction carrying part 212. Suction carrying member 216 having its lower side furnished with disklike suction part 214 is connected through spring (not shown) to lower ends of the suction carrying part 212. Therefore, a construction permitting vertical movement against the suction carrying part 212 is realized and the impact exerted at the time of suction holding can be lessened. The suction part 214 of the suction carrying member 216 is fitted with suction member 218 composed of, for example, a porous ceramic. The suction member 218 is caused to have a negative pressure by connecting it to a vacuum source such as a vacuum pump not shown, so that an entire area of the chip side surface of the wafer W is held by suction by means of the suction member 218 to thereby enable fixing of the wafer W. By virtue of this construction, the breakage and damaging of the chips of the wafer W can be prevented.

Therefore, the wafer carrying unit 200 is so constructed that the carrying arm 210 is rotated around the rotary shaft 206 by actuating the drive motor 202 so that the suction part 214 of the suction carrying member 216 is positioned just above the delivery table base 106 of the delivery table 100. Then, all the chip side surface of the wafer W is held through the suction member 218 (suction pad member) by suction. While the suction holding is maintained, the carrying arm 210 is rotated around the rotary shaft 206 by actuating the drive motor 202 to thereby carry the wafer W to ultraviolet irradiation unit 300.

The ultraviolet irradiation unit 300 is fitted with UV lamp house 304 having UV lamp tube 302 which is arranged below the wafer carrying arm 210, as shown in FIG. 4. The ultraviolet light emitted from the UV lamp tube 302 is irradiated upward by reflecting mirror 306.

That is, while the carrying arm 210 is rotated round the rotary shaft 206 by actuating the drive motor 202 so that the wafer W passes above the ultraviolet irradiation unit 300 and is carried to positioning unit 400, the lower side, namely the protective tape P side, of the wafer W held by suction by the suction part 214 of the suction carrying member 216 of the wafer carrying unit 200 is irradiated with ultraviolet light emitted from the UV lamp tube 302.

The purpose thereof is that, when an ultraviolet curable pressure sensitive adhesive is used in the adhesive of the protective tape P for holding, by sticking, the wafer W having been divided into a multiplicity of chips, the bonding strength exerted at the time of peeling the protective tape is reduced by irradiating the protective tape with ultraviolet light to thereby enable easily peeling the protective tape from the multiplicity of chips.

The wafer W having been irradiated with ultraviolet light while passing the ultraviolet irradiation unit 300 is carried to positioning unit 400 in the state of being held by suction by the suction part 214 of the suction carrying member 216 of the wafer carrying unit 200. The wafer W is delivered to and disposed on positioning table 401 so that the chip side surface lies upward.

Figure 6:
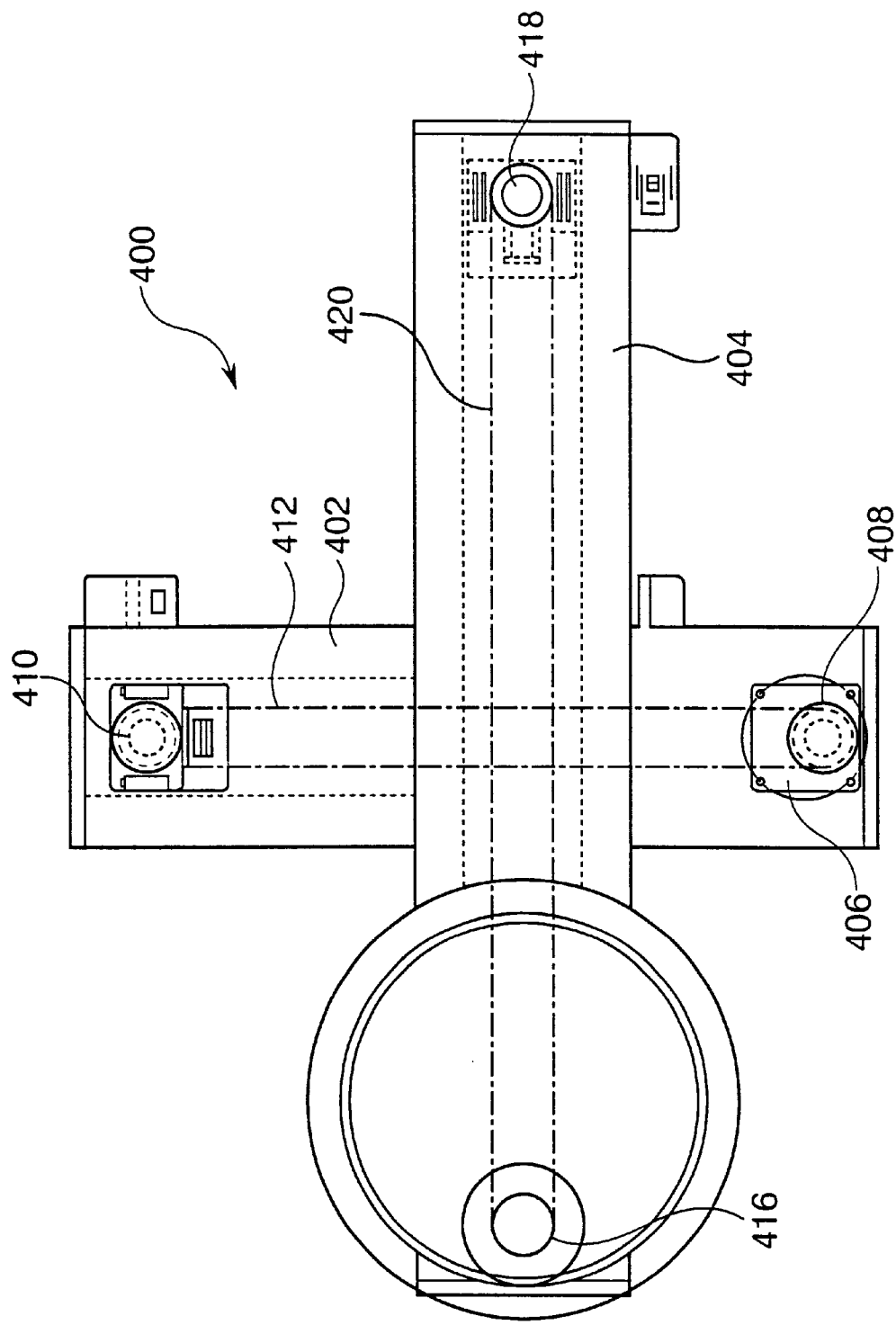
FIG. 6 is a top view of a positioning unit included in the wafer transfer apparatus of the present invention.
Figure 7:
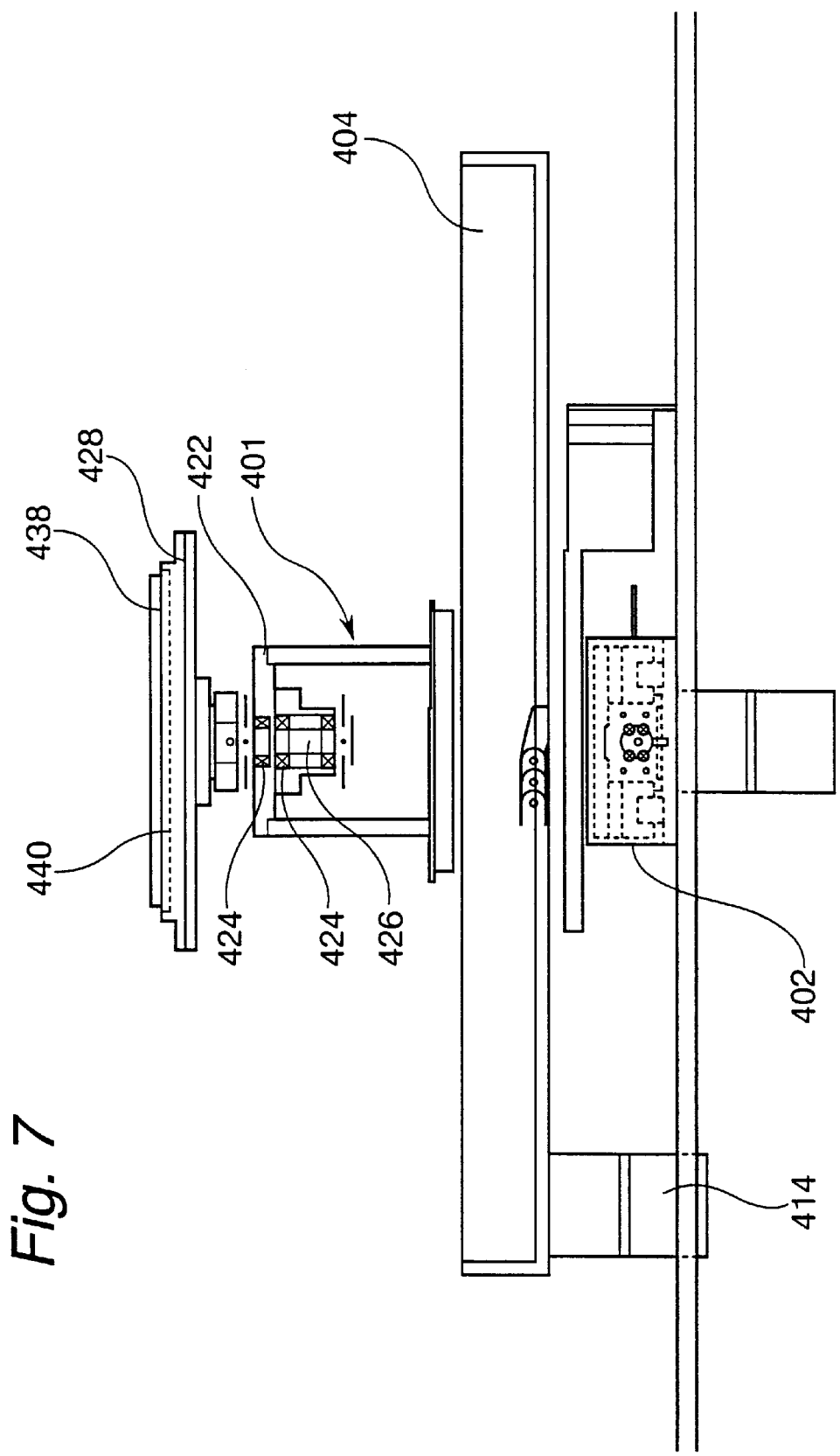
FIG. 7 is a front view of the positioning unit shown in FIG. 6.
Figure 8:
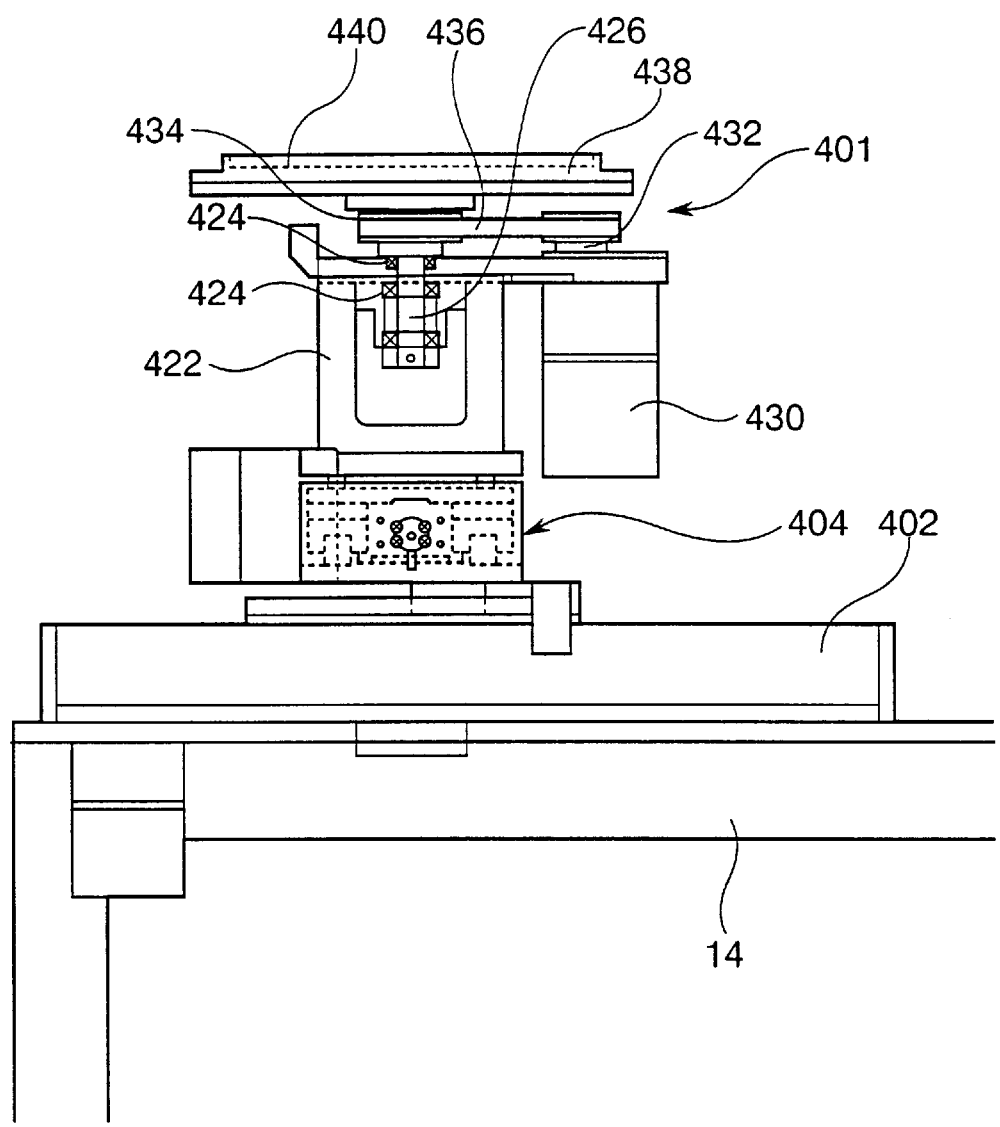
FIG. 8 is a right side view of the positioning unit shown in FIG. 6.

Referring to FIGS. 6 to 8, the positioning unit 400 comprises Y-axis direction rail 402 fixed to the base 14 of the wafer transfer apparatus 10 and arranged in the front and rear direction (Y-axis direction) according to the apparatus of the invention and X-axis direction rail 404 arranged in the right and left direction (X-axis direction) according to the apparatus of the invention so as to cross the Y-axis direction rail 402 at right angle. Furthermore, the X-axis direction rail 404 is so constructed that it is movable on the Y-axis direction rail 402 in the Y-axis direction. Positioning table 401 is fitted on the X-axis direction rail 404 and this positioning table 401 is so constructed that it is movable on the X-axis direction rail 404 in the X-axis direction.

A front end side of the Y-axis direction rail 402 is fitted with drive motor 406. Driving belt 412 is passed over the rims of pulley 408 of the driving shaft of the drive motor 406 and pulley 410 provided on a rear end side of the Y-axis direction rail 402. Therefore, the driving belt 412 is moved in the X-axis direction by the rotation of the drive motor 406. Construction is made such that, in accordance therewith, the X-axis direction rail 404 and the positioning table 401 provided thereon are moved in the Y-axis direction by means of guide member (not shown) fixed to the driving belt 412 and coupled with the X-axis direction rail 404.

On the other hand, a left end side of the X-axis direction rail 404 is fitted with drive motor 414. Driving belt 420 is passed over the rims of pulley 416 of the drive motor 414 and pulley 418 provided on a right end side of the X-axis direction rail 404. Therefore, the driving belt is moved in the X-axis direction by the rotation of the drive motor 414. Construction is made such that, in accordance therewith, the positioning table 401 is moved in the X-axis direction by means of guide member (not shown) fixed to the driving belt 420 and coupled with the positioning table 401.

The positioning table 401 includes positioning table frame 422 and positioning table base part 428 secured to the positioning table frame 422 by means of bearing 424 so as to be rotatable around rotary shaft 426. Construction is made such that the rotation of drive motor 430 provided on the positioning table frame 422 is transmitted to the positioning table base part 428 by means of driving belt 436 passing over the rims of pulley 432 of the driving shaft of the drive motor 430 and pulley 434 provided on the rotary shaft 426. As a result, the positioning table base part 428 is rotated round the rotary shaft 426.

Disk-shaped wafer accommodation part 438 is arranged on an upper surface of the positioning table base part 428. This wafer accommodation part 438, like the aforementioned wafer carrying unit 200, is fitted with porous suction member 440 capable of attracting all the surface of the wafer by suction. The suction member 440 is caused to have a negative pressure by connecting it to a vacuum source such as a vacuum pump not shown, so that an entire area of the protective tape side surface of the wafer W is held by suction by means of the suction member 440 to thereby enable fixing of the wafer W.

With respect to the positioning unit 400 of the above construction, the wafer W having been irradiated with ultraviolet light while passing above the ultraviolet irradiation unit 300 is carried to the positioning unit 400. During this carrying, the wafer W is maintained in the state that it is held by suction by the suction part 214 of the suction carrying member 216 of the wafer carrying unit 200. The wafer W is delivered to and disposed on the wafer accommodation part 438 of the positioning table base part 428 of the positioning table 401 so that the chip side surface lies upward. Thus, suction holding of the wafer W is accomplished.

With this state maintained, a position adjustment is effected in longitudinal and lateral directions (XY-directions) and rotational direction (θ-direction) along chipped wafer division lines of the wafer W by the use of an image recognition camera (not shown) arranged above the positioning unit 400. As a result, the wafer is located in a reference position, so that accurate die bonding in the die bonding-step can be performed. This position adjustment can be performed by recognizing the position of the orientation flat or notch of the wafer W.

That is, the positioning table 401 is moved on the X-axis direction rail 404 in the X-axis direction to thereby determine the X-axis direction position of the wafer. The X-axis direction rail 404 and the positioning table 401 provided thereon are moved on the Y-axis direction rail 402 in the Y-axis direction to thereby determine the Y-axis direction position of the wafer. The positioning table base part 428 is rotated around the rotary shaft 426 to thereby determine the rotational direction position of the wafer. Thus, the wafer is located in the reference position.

The wafer W thus positioned by the positioning table 401 of the positioning unit 400 is carried by means of wafer carrying unit 500 and disposed on transfer tape mount table 602 of transfer tape mount unit 600 so that the chip side surface of the wafer W lies upward.

Figure 9:
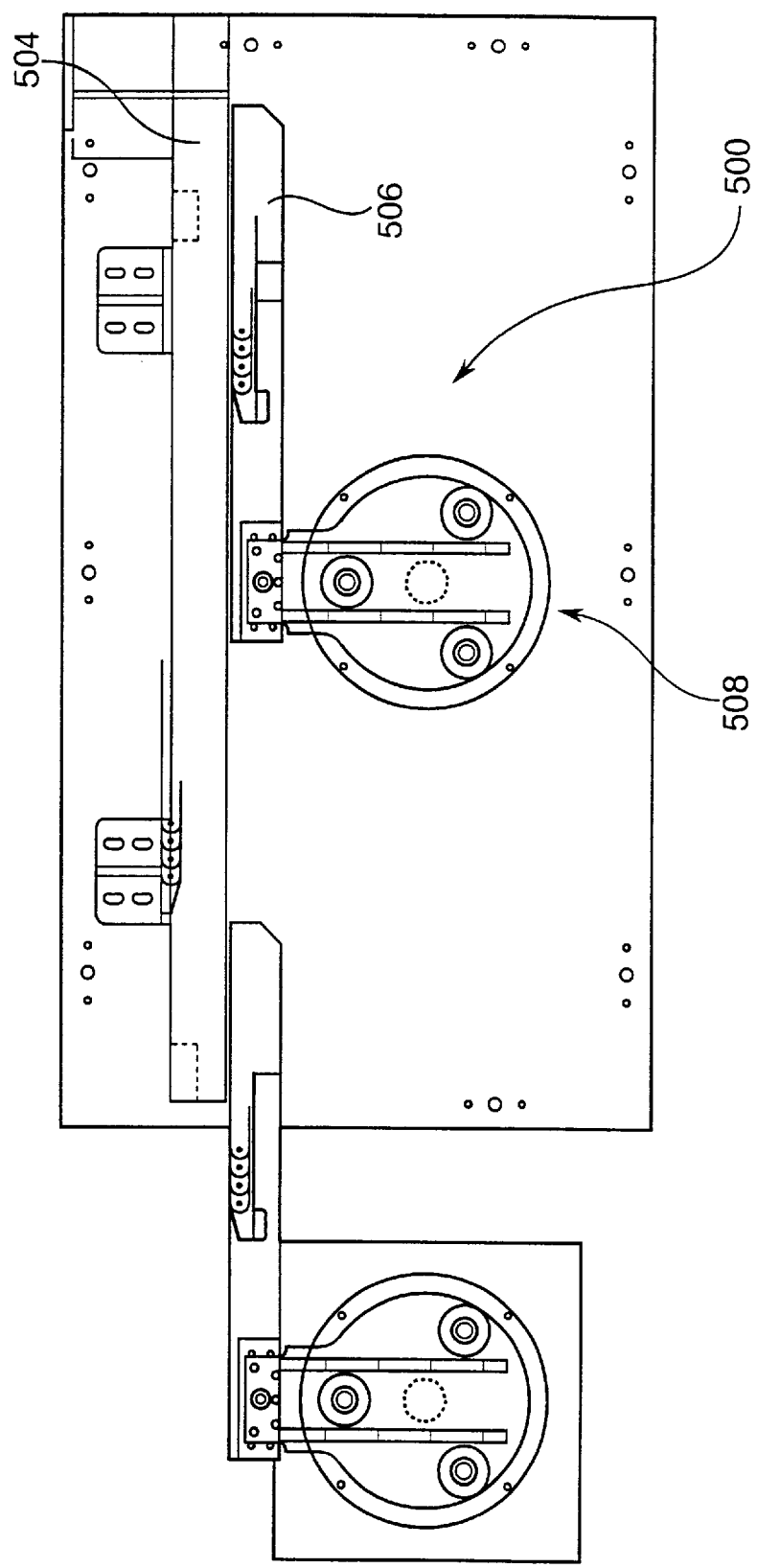
FIG. 9 is a top view of the wafer carrying unit.
Figure 10:
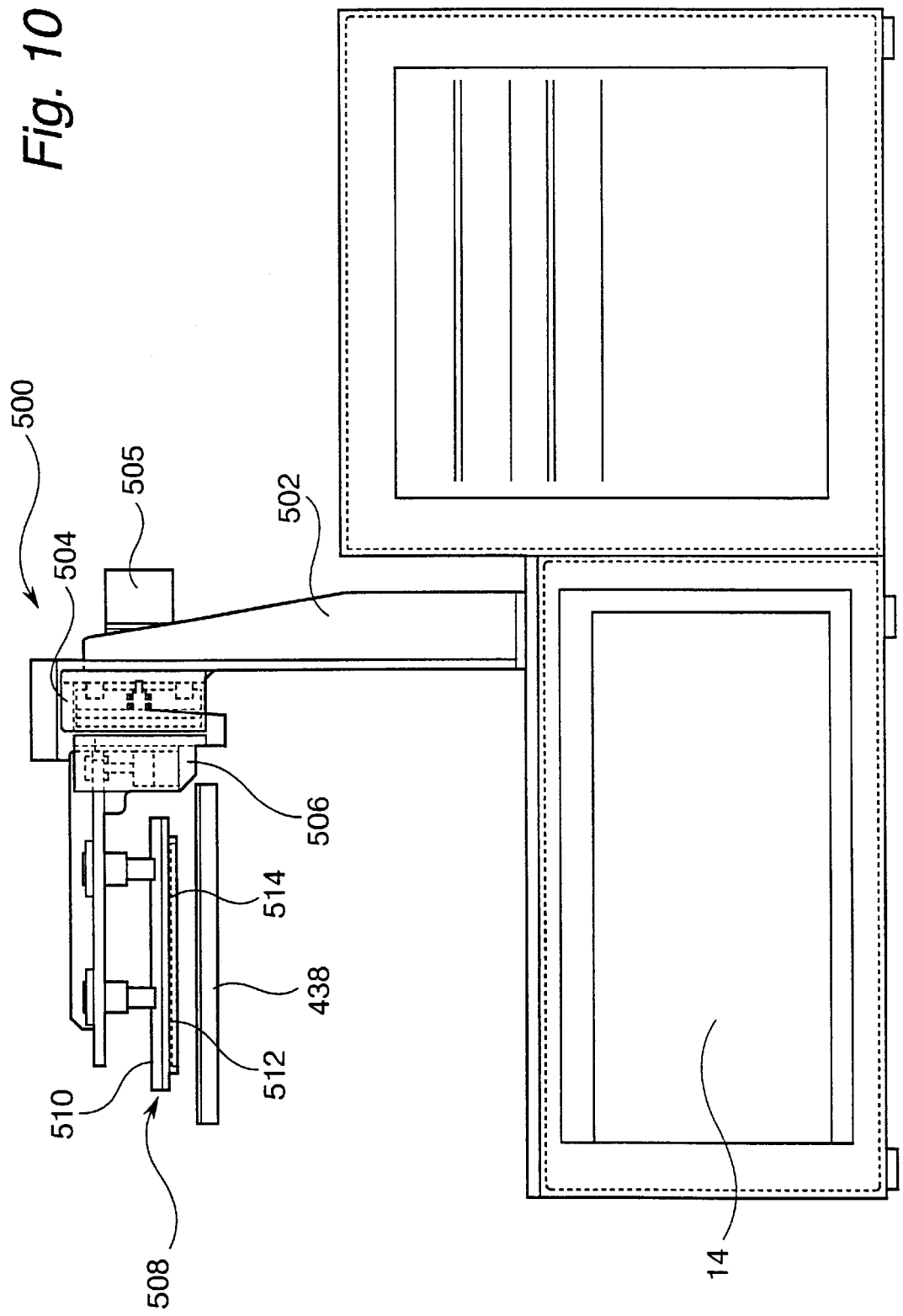
FIG. 10 is a side view of the wafer carrying unit shown in FIG. 9.

The wafer carrying unit 500, referring to FIGS. 9 and 10, is fixed onto the base 14 of the wafer transfer apparatus 10 by bracket 502 and is fitted with guide rail 504 arranged so as to extend from the positioning unit 400 to the transfer tape mount unit 600 in the X-axis direction. The wafer carrying unit 500 is further fitted with carrying guide member 506 beside the guide rail 504. The carrying guide member 506 is movable along the guide rail 504 when driven by a timing belt (not shown) connected to motor 505. This carrying guide member 506 at its left end is fitted with carrying arm 508. The carrying arm 508 is provided with suction carrying member 510 which is so constructed as to be movable vertically against the carrying arm 508 by means of spring (not shown), whereby the impact exerted at the time of suction holding can be lessened. This suction carrying member 510 at its lower side is provided with disklike suction part 512. This suction part 512 is also fitted with porous suction member 514 capable of attracting all the wafer surface by suction, so that suction holding of all the chip side surface of the wafer W can be realized by applying a negative pressure.

In the wafer carrying unit 500 of the above-mentioned construction, the carrying guide member 506 is moved along the guide rail 504 until locating just above the wafer accommodation part 438 of the positioning table 401 of the positioning unit 400 (right side of FIG. 9). Then, negative pressure of the wafer accommodation part 438 of the positioning table 401 is canceled to thereby cancel the suction holding and the wafer W positioned by the positioning table 401 is sucked and held by a negative pressure at the suction part 512 provided on the lower side of the suction carrying member 510. Further, with this state maintained, the carrying guide member 506 is moved along the guide rail 504 until the transfer tape mount unit 600 (left side of FIG. 9) and the wafer W is moved and disposed on the transfer tape mount table 602 of the transfer tape mount unit 600.

The transfer tape mount unit 600, referring to FIG. 1, is fitted with the transfer tape mount table 602, in front of which ring frame stocker 604 in which a multiplicity of ring frames are accommodated is arranged. A multiplicity of ring frames R are piled one upon another and accommodated in the ring frame stocker 604. And the ring frame stocker 604 is vertically slidable along guide rail (not shown) arranged in the vertical direction.

Referring to FIG. 1, above the ring frame stocker 604, guide rail 624 is arranged in the Y-axis direction from the transfer tape mount table 602 to the ring frame stocker 604. Ring carrying arm 626 is so constructed as to be movable along the guide rail 624. The ring carrying arm 626 is fitted with a vacuum suction part having its front edge furnished with a vacuum pad (not shown).

Therefore, by the wafer carrying unit 500, the wafer W positioned by the positioning table 401 is moved and disposed on the transfer tape mount table 602 of the transfer tape mount unit 600 so that the chip side surface of the wafer W lies upward. Subsequently, the ring carrying arm 626 is moved along a guide cylinder until being located just above the ring frame stocker 604. Thereafter, ring frame stocker 604 is elevated along guide rail so that the ring frame R lying uppermost is held by suction by means of the ring carrying arm 626. Then, the ring frame stocker 604 is caused to descend, and simultaneously the ring carrying arm 626 is moved along the guide rail 624 until locating just above the transfer tape mount table 602. As a result, the ring frame R is moved and disposed around the periphery of the wafer W placed on the transfer tape mount table 602.

Suction table 603 is arranged inside the transfer tape mount table 602, and, on the upper side thereof as well, a porous suction member capable of attracting all the wafer surface by suction is provided. Therefore, suction holding of an entire area of the protective tape P side surface of the wafer W can be effected by the application of a negative pressure.

Thus, the wafer W and the ring frame R, which is provided around the periphery of the wafer W, are held by suction on the upper surface of the suction table 603. Thereafter, transfer tape T, which is precut in conformity with the shape of the ring frame R in advance, is stuck to the upper sides of the wafer W and ring frame R by transfer tape supply unit 650.

Figure 11:
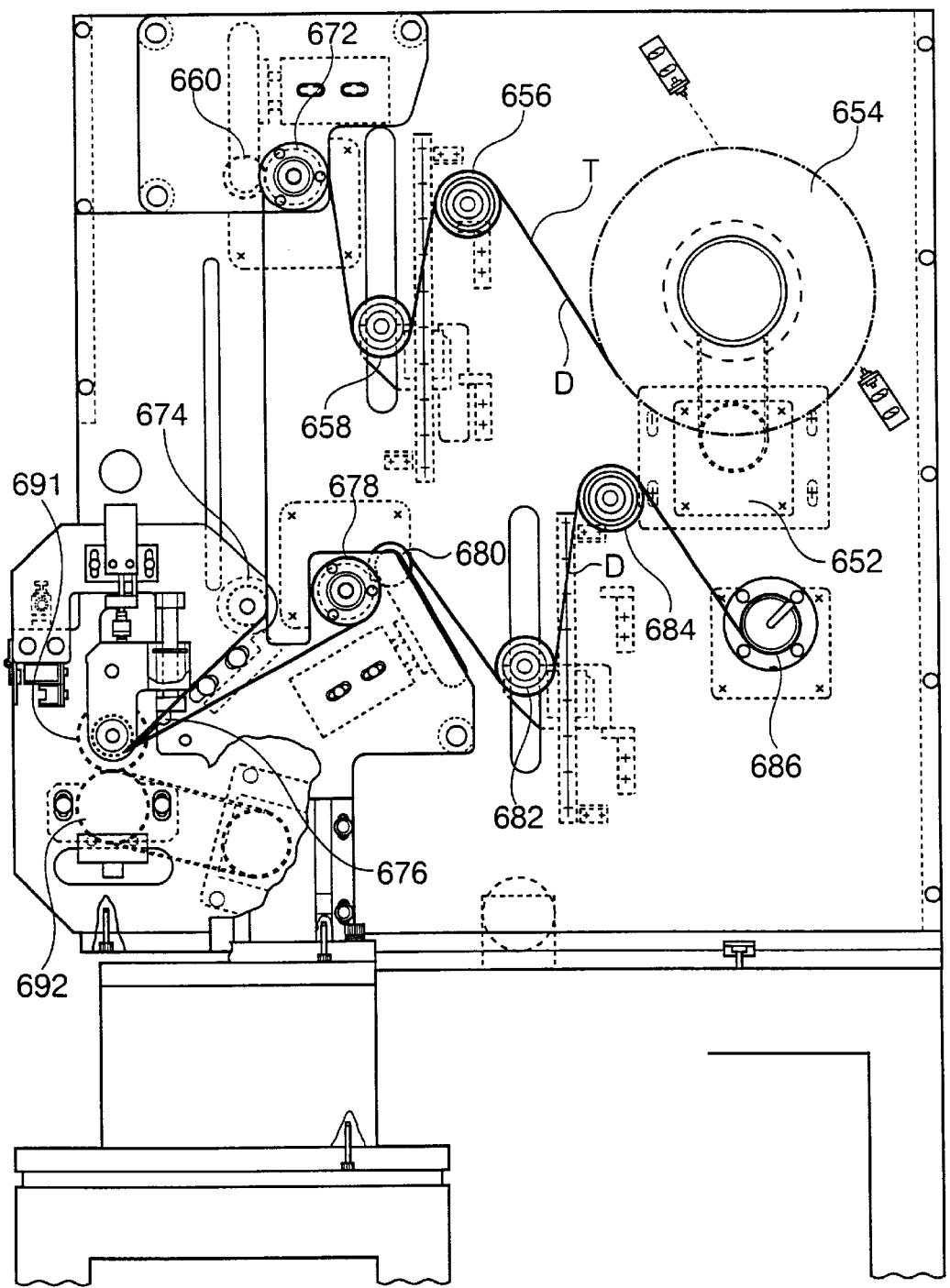
FIG. 11 is a side view of a transfer tape supply unit.

In the transfer tape supply unit 650, referring to FIG. 11, transfer tapes T, which is precut and stuck onto release liner D at given intervals in advance, is carried from unwinder 654 and passed through guide roller 656, dancer roller 658, spacing of tension roller 672 and pinch roller 660 and guide roller 674 by actuation of transfer tape supply motor 652. The release liner D is sharply folded back with an acute angle at a front edge portion of peel plate 676 to thereby enable peeling of the transfer tapes T from the release liner D. Thereafter, the release liner D passes spacing of takeup roller 678 and pinch roller 680, dancer roller 682 and guide roller 684 and is wound around winder 686.

Although not shown, a tape detection device is arranged between the spacing of the tension roller 672 and the pinch roller 660 and a transfer tape through path portion of the guide roller 674 so that tapes are stopped at a given position by controlling supply motor 692.

The transfer tape T having been thus peeled from the release liner D are simultaneously stuck to both the ring frame R and the wafer W by means of press roller 691.

In order to cope with changes of the outer diameter of the transfer tape, each of the dancer rollers 658, 682 is moved in the vertical direction and the vertical position thereof is detected to thereby control the driving of the transfer tape supply motor 652 and winder 686.

On the other hand, referring to FIG. 1, the transfer tape mount table 602 is movable along guide rail 690, which is provided in the cross direction, by means of guide member 688 provided beside the transfer tape mount table 602. By virtue of this construction, the transfer tape mount table 602 can be moved in such a direction that the transfer tape mount table 602 is drawn close to or apart from the transfer tape supply unit 650.

Thus, referring to FIG. 12(*a*), the transfer tape mount table 602 is moved along the guide rail 690 in such a direction that the transfer tape mount table 602 is drawn close to the peel plate 676. One edge portion of the ring frame R is caused to locate in the vicinity of the front edge portion of the peel plate 676.

Transfer tapes T are peeled from the release liner D by sharply folding back the release liner D with an acute angle at the front edge portion of the peel plate 676. At that time, the front edge portion of transfer tapes T is assisted by, for example, air blow so as to prevent following to the release liner D.

Thereafter, referring to FIG. 12(*b*), the transfer tape mount table 602 is elevated by means of a vertical cylinder not shown. Then, the front edge portion of transfer tapes T is stuck under pressure to the ring frame R by means of the press roller 691.

Further, referring to FIG. 12(*c*), the transfer tape mount table 602 is moved along the guide rail 690 in such a direction that the transfer tape mount table 602 is drawn apart from the peel plate 676. Simultaneously with this movement, transfer tape T is stuck to the wafer W and the ring frame R arranged around the wafer W by means of the press roller 691. As a result, the wafer W is integrated with the ring frame R.

Thereafter, referring to FIG. 1, the ring frame R portion around the periphery of the wafer W is held by suction by means of vacuum pad 642 of arm part 641 of rotary arm unit 640 arranged beside the transfer tape mount table 602. Thereafter, the arm part 641 of the rotary arm unit 640 is rotated by 180° about rotary shaft 644, so that the surface of the protective tape P sticking the wafer W comes to lie upward.

Referring further to FIG. 1, carrying member 752 of carrying arm unit 750 is moved along guide rail 754 extending in the X-axis direction up to the center of the rotary arm unit 640. The wafer W integrated with the ring frame R by means of transfer tape, which has been held by suction by means of the rotary arm unit 640, is held by suction by vacuum pad 756 of the carrying arm unit 750 and delivered thereto. Then, the carrying member 752 is moved along the guide rail 754 so that the wafer W is disposed on protective tape peeling table part 802 of protective tape peeling unit 800.

Figure 13:
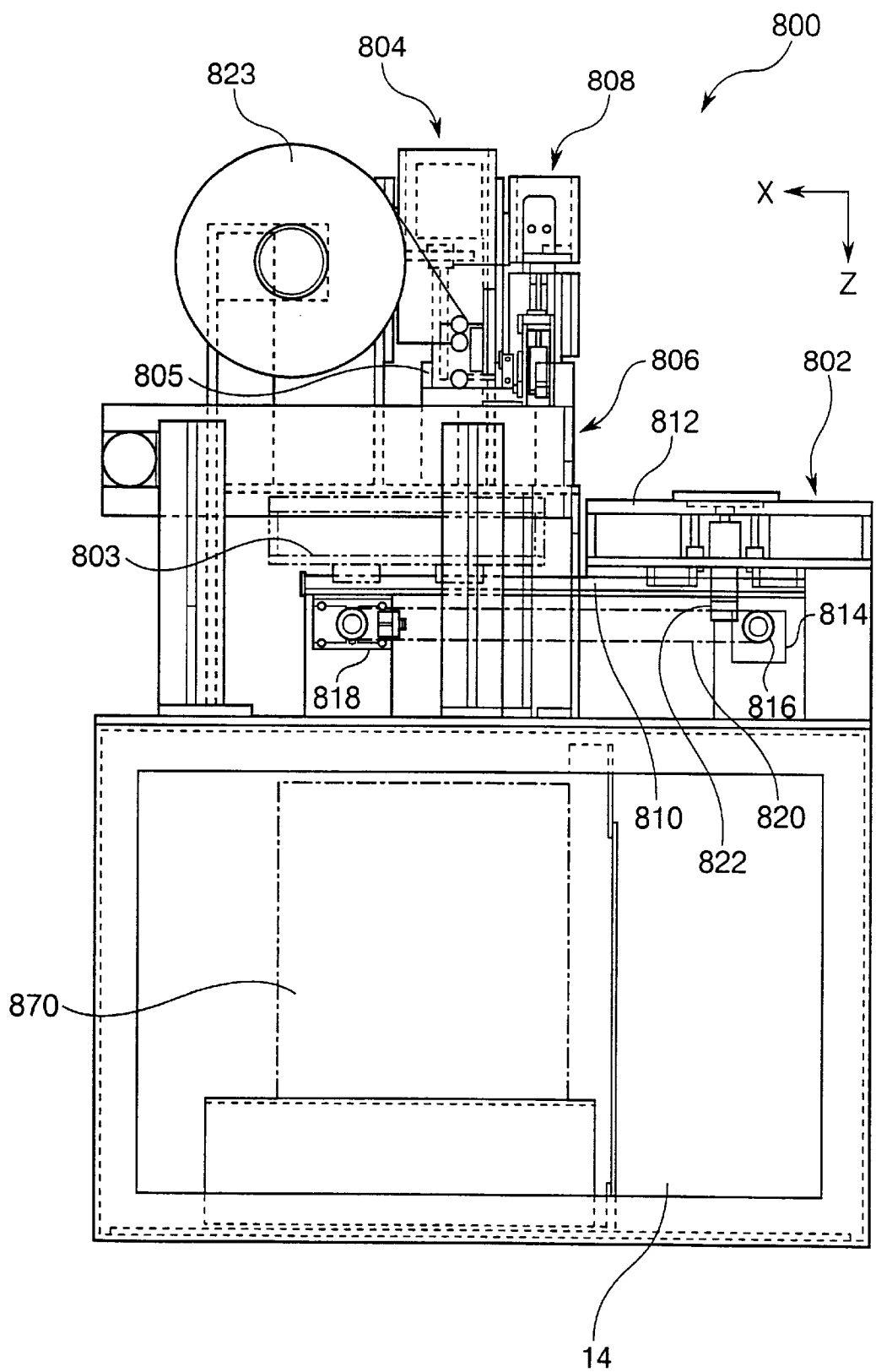
FIG. 13 is a front view of a protective tape peeling unit for use in the present invention.
Figure 14:
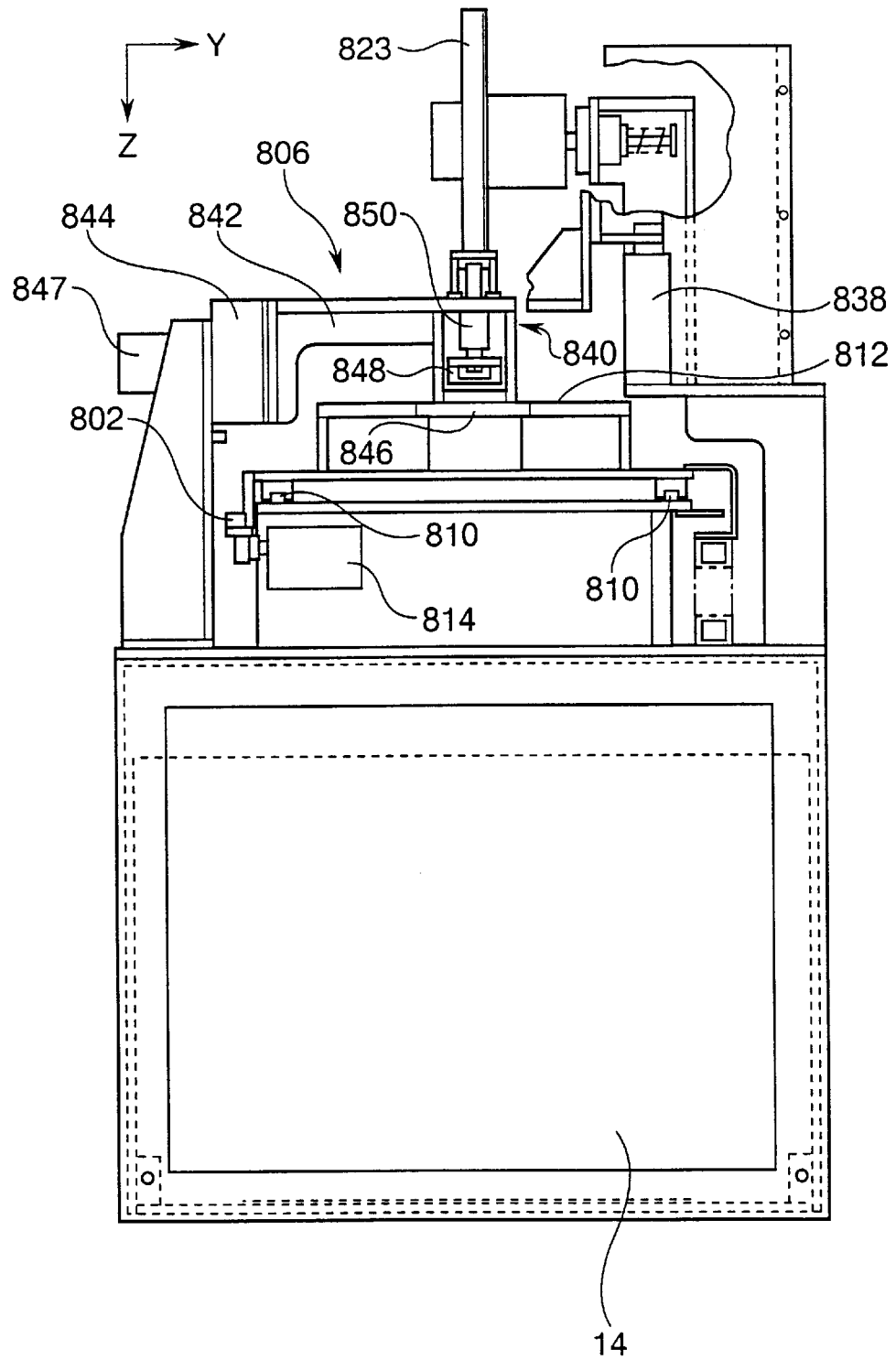
FIG. 14 is a side view of the protective tape peeling unit shown in FIG. 13.
Figure 15:
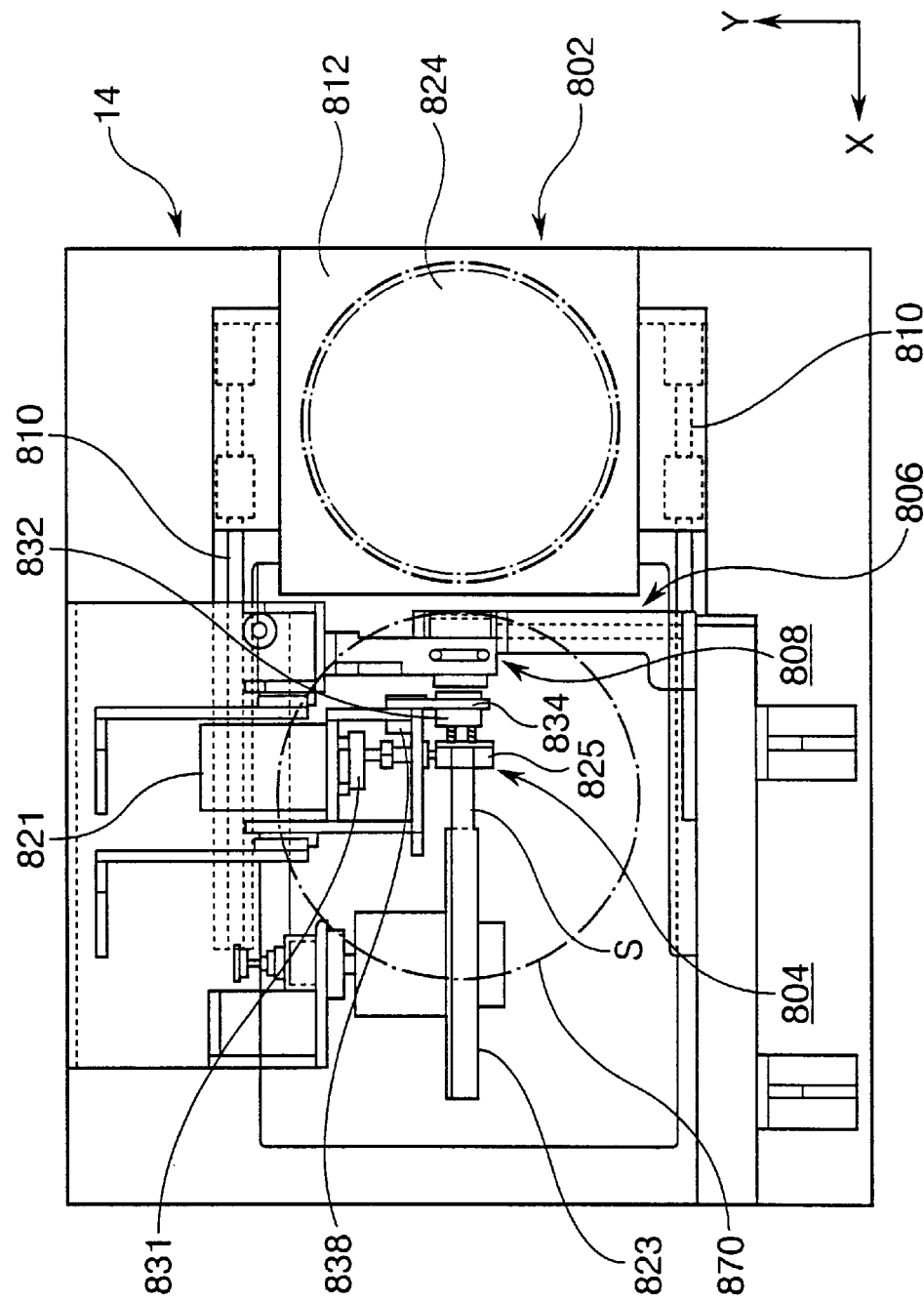
FIG. 15 is a plan view of the protective tape peeling unit shown in FIG. 13.

The protective tape peeling unit 800, referring to FIGS. 13 to 15, comprises table part 802, tape supply part 804, peeling head part 806 as moving means, and heater cutter part 808 as bonding/cutting means.

The table part 802 is fitted with table 812 which is movable in the longitudinal direction on rail 810 arranged on the base 14 of the wafer transfer apparatus 10. Actuation of motor 814 causes the table 812 to move in the X-axis direction on the rail 810, by means of coupler 822 coupled with belt 820 passing over the rims of pulley 816 of the driving shaft of the motor and pulley 818. The table 802 on its upper surface is also fitted with porous suction member 824 capable of attracting an entire area of the wafer surface by suction, so that suction holding of all the surface of the wafer W through the transfer tape T can be realized by applying a negative pressure.

Figure 17:
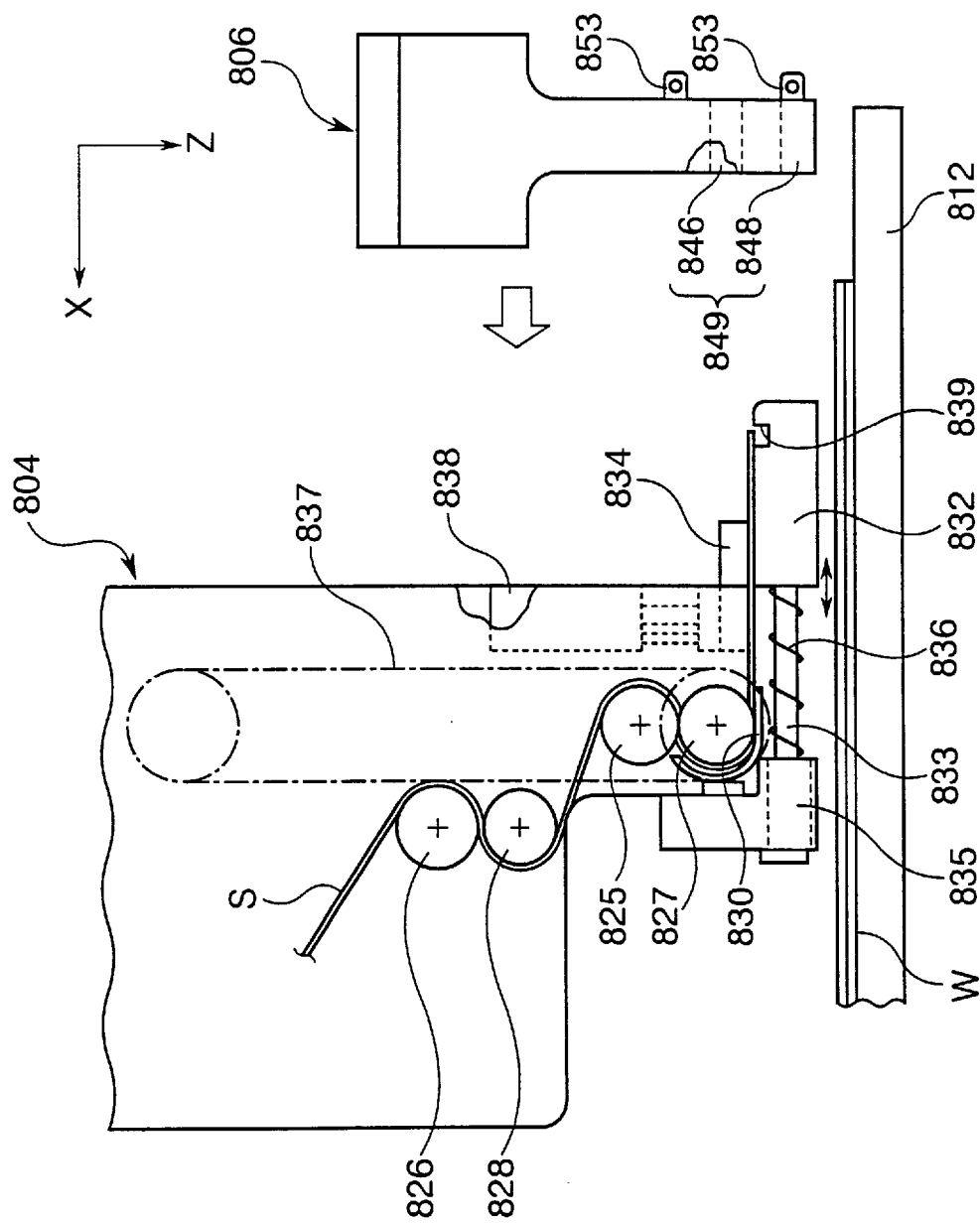
FIGS. 17 to 23 are respectively a view for explaining the motion and function of the protective tape peeling unit for use in the present invention.

The tape supply part 804, referring to FIG. 17, comprises pinch roller 825 and tension roller 827 brought into contact with each other under pressure, guide roller 828 and pinch roller 826. At a lower end portion of the tape supply part 804, tape receiving plate 832 is secured to ball bush 835 by means of shaft 833. The tape receiving plate 832 is movable along the X-axis direction and is constantly biased against in the protrudent direction (rightward in FIG. 17) by means of spring 836.

Peeling tape S is fed from reel 823 and sandwiched between the pinch roller 826 and the guide roller 828. The direction thereof is changed by the guide roller 828. Further, the peeling tape S is sandwiched between the pinch roller 825 and the tension roller 827, and is forwarded onto the tape receiving plate 832 and is pressed on the tape receiving plate 832 by means of tape presser plate 834. Cutter groove 839 is provided at a front end portion of the tape receiving plate 832. The tape presser plate 834 is driven so as to be vertically movable by means of cylinder 838. Timing belt 837 passes over the tension roller 827 and the rim of timing pulley 831, and the timing pulley 831 is driven by motor 821 (see FIG. 15). The tension roller 827 is rotated in the direction reverse to the supply direction of the peeling tape S so that the peeling tape S is provided with tension exerted in the direction reverse to the supply direction (back tension).

The tension roller 827 on its rear side (left side in FIG. 17) is fitted with tape presser guide 830, which prevents the backward move of the peeling tape S held on the tape receiving plate 832.

The tape supply part 804 is movable along the vertical direction (Z-axis direction shown in the figure). Specifically, referring to FIG. 13, base plate 803 is arranged on the base 14, and the tape supply part 804 is moved along the Z-axis direction by cylinder 805 fixed on the base plate 803.

A heat resistant film such as polyethylene terephthalate film provided with a heat sensitive adhesive layer or a peeling tape itself having heat sensitivity can be used as the peeling tape S.

The peeling head part 806 comprises peeling head 840 and arm 842 supporting the peeling head 840. The arm 842 is so constructed as to be movable in the longitudinal direction on guide 844 by actuating motor 847. The peeling head 840 is fitted with chuck 849 consisting of upper jaw 846 and lower jaw 848 and is vertically moved by cylinder 850 so that the chuck 849 can be opened and closed. In the figure, numeral 853 denotes tape detection sensor.

The heater cutter part 808, referring to FIG. 16, is fitted with heater block 852 which can be vertically moved by means of cylinder 851. Heater 854 is embedded inside the heater block 852, and a lower end of the heater block 852 is provided with heater tool 855.

Front and rear sides of the heater block 852 are fitted with tape presser guides 856. The rear side of the heater block 852 is further fitted with tape presser 858 and also fitted with cutter blade 864 which is moved in the cross direction along groove 862 of the tape presser 858 by means of cylinder 860.

The protective tape peeling unit 800 constructed as above is operated as shown in FIGS. 17 to 23.

Referring to FIG. 17, the peeling tape S is fed until reaching the cutter groove 839, and simultaneously the table 812 is moved until reaching a point under the tape supply part 804. In this state, a back tension is applied to the peeling tape S by means of the tension roller 827. Then, the peeling head part 806 is moved in such a direction that the peeling head part 806 is drawn close to the tape supply part 804. During that time, the chuck 849 is held open.

Figure 18:
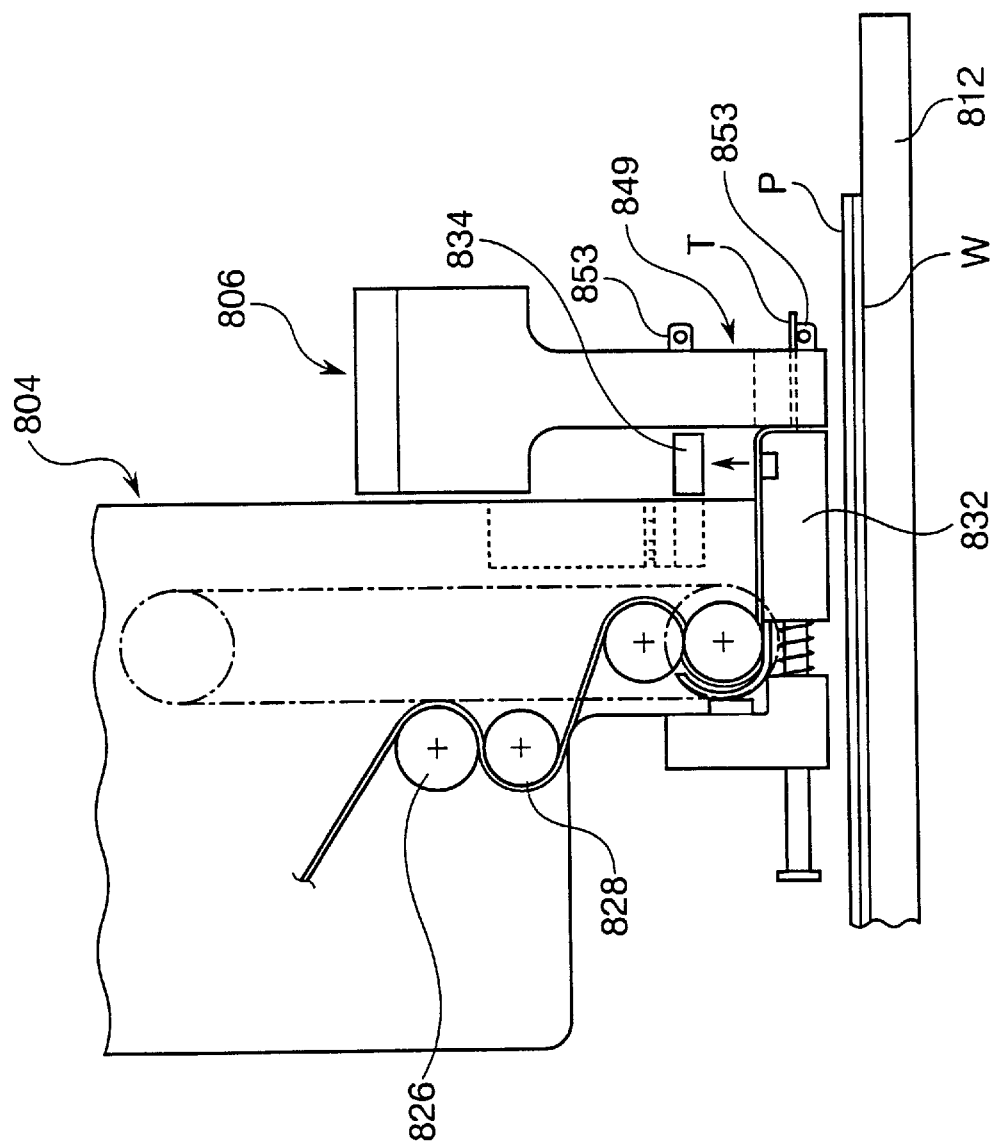

Referring now to FIG. 18, the peeling head part 806 presses the tape receiving plate 832. Simultaneously, the front edge of the peeling tape S is detected by the tape detection sensor 853, followed by closing of the chuck 849. The peeling tape S is held between the jaws in the chuck 849, and the tape presser plate 834 is raised to thereby cancel the back tension of the peeling tape S.

Figure 19:
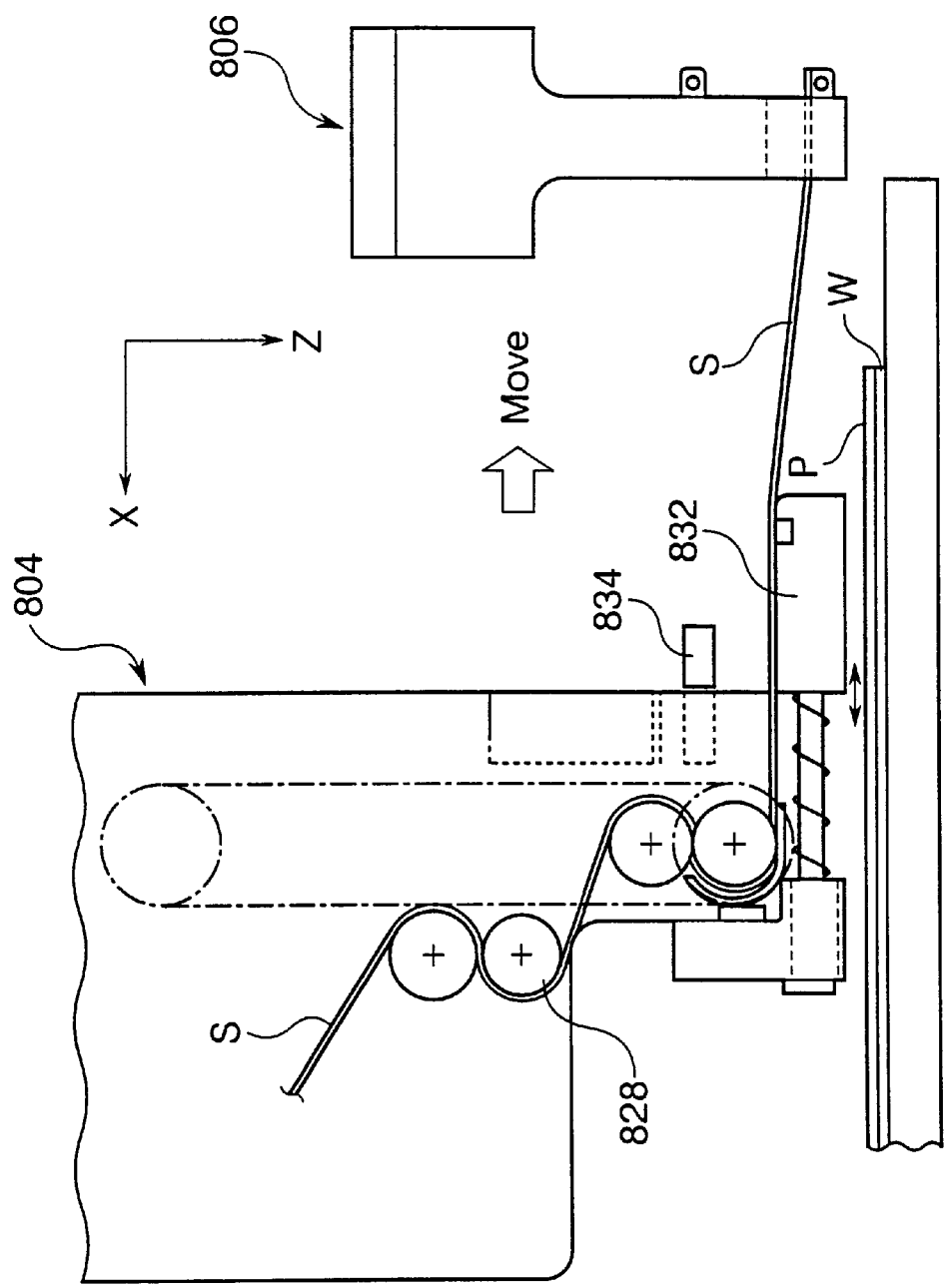

Further referring to FIG. 19, the peeling head part 806 is moved in such a direction that the peeling head part 806 is drawn apart from the tape supply part 804 to thereby pull out the peeling tape S.

Figure 20:
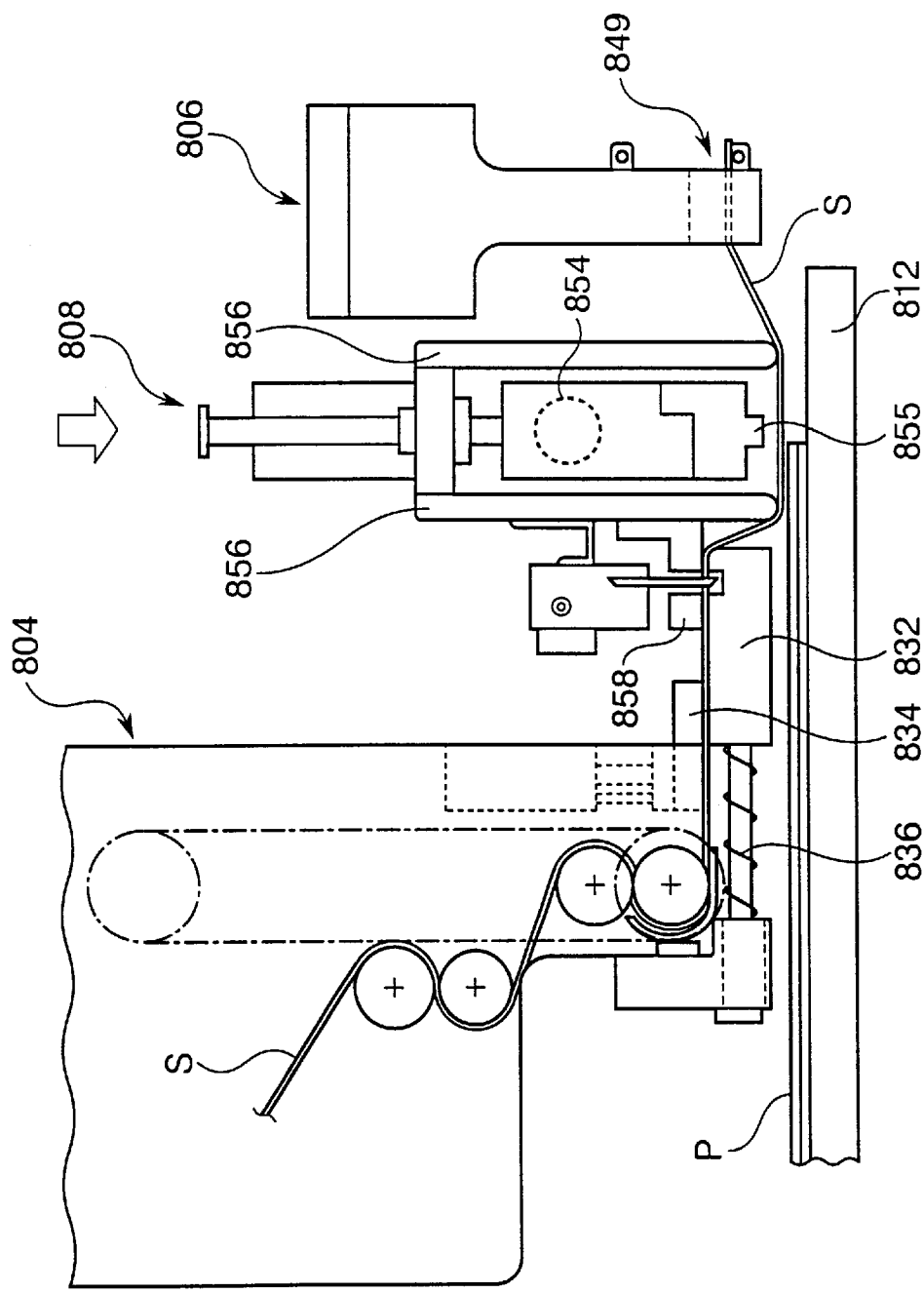

Thereafter, referring to FIG. 20, the heater cutter part 808 is caused to descend so that the peeling tape S is pressed by means of the tape presser 858 and the tape presser guides 856. Simultaneously, the peeling tape S is bonded by thermal fusion to the protective tape P of the wafer surface, with the use of heat from the heater 854 of the heater block 852 by means of the heater tool 855. The peeling tape S is cut to a given length by moving the cutter blade 864 in the Y-axis direction along the groove 862 of the tape presser 858. It is preferred that the bonding point lie in the vicinity of an edge of the wafer W, for example, within 3 mm from the edge of the wafer W.

Figure 21:
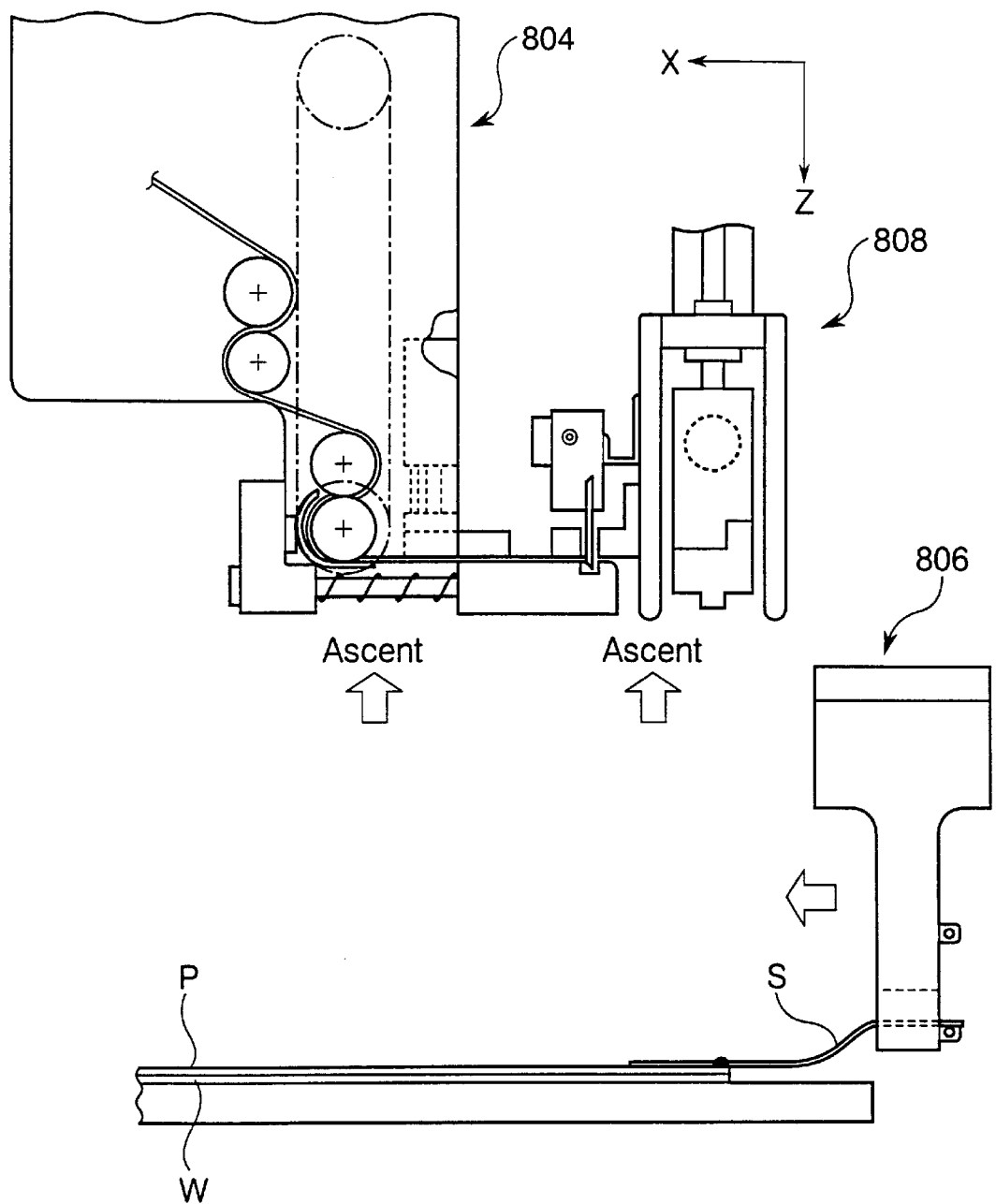
Figure 22:
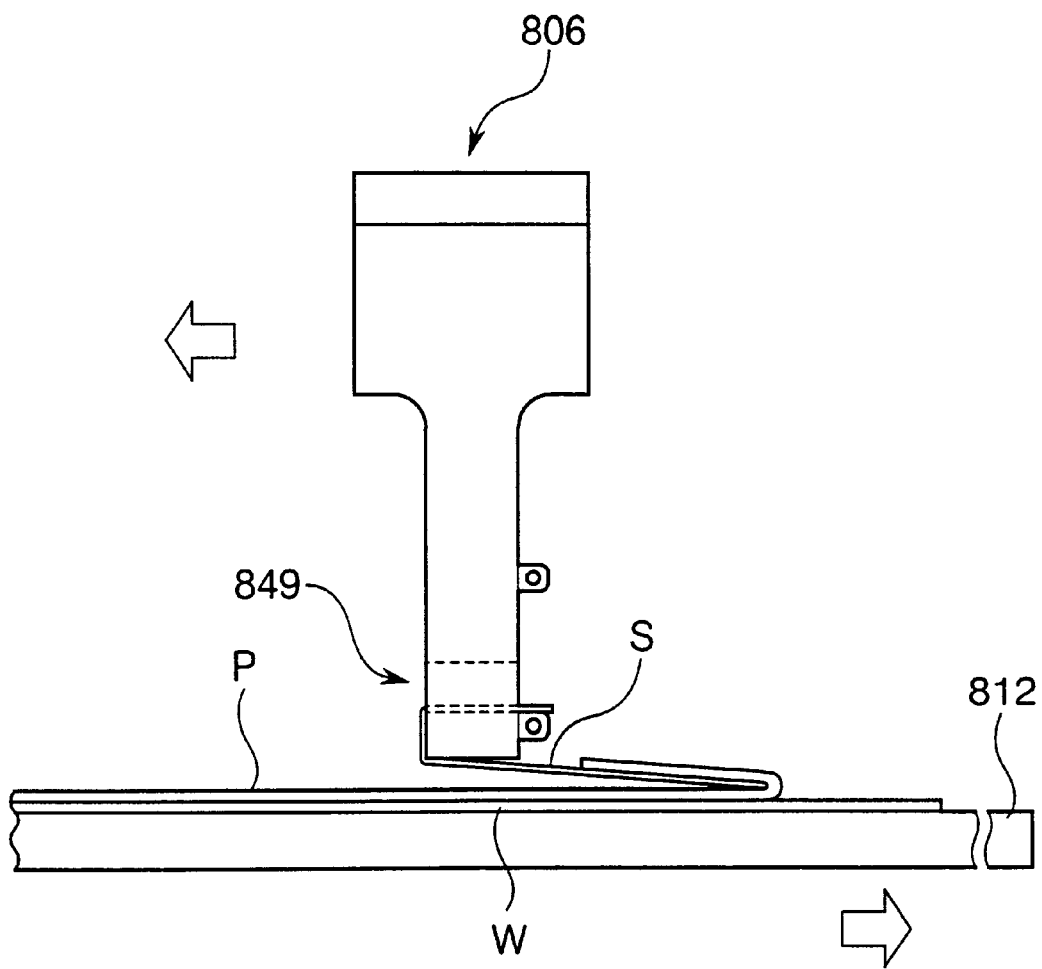

The tape supply part 804 and the heater cutter part 808 are raised as shown in FIG. 21. Thereafter, the peeling head part 806 and the table 812 are moved in such directions that these are drawn apart from each other as shown in FIG. 22. As a result, the protective tape P on the wafer surface can be peeled from the wafer surface by means of the peeling tape S. It is preferred that the angle of peeling of the peeling tape S from the wafer W is in the vicinity of 180°. When the peeling angle is in the vicinity of 180°, the peeling can be performed without the dislocation of divided chips of the wafer W.

Figure 23:
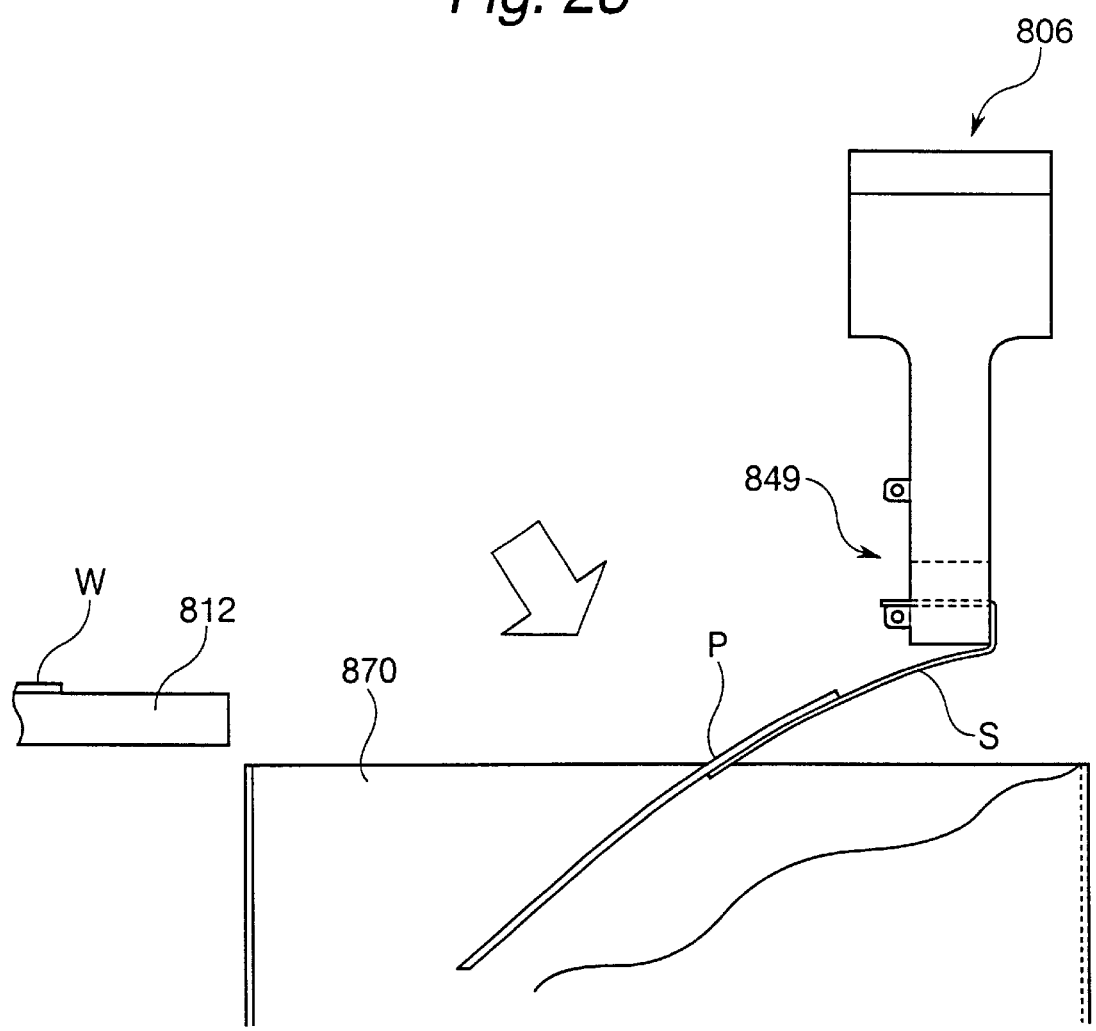

Referring to FIG. 23, the thus peeled peeling tape S and protective tape P are dropped into scrap box 870 for accommodation therein by opening the chuck 849 of the peeling head part 806 and simultaneously conducting an air blow from above.

The wafer W having the protective tape thus peeled from the wafer surface by the protective tape peeling unit 800 is moved and disposed on discharge pusher unit 900 by means of carrying arm unit 950.

Figure 24:
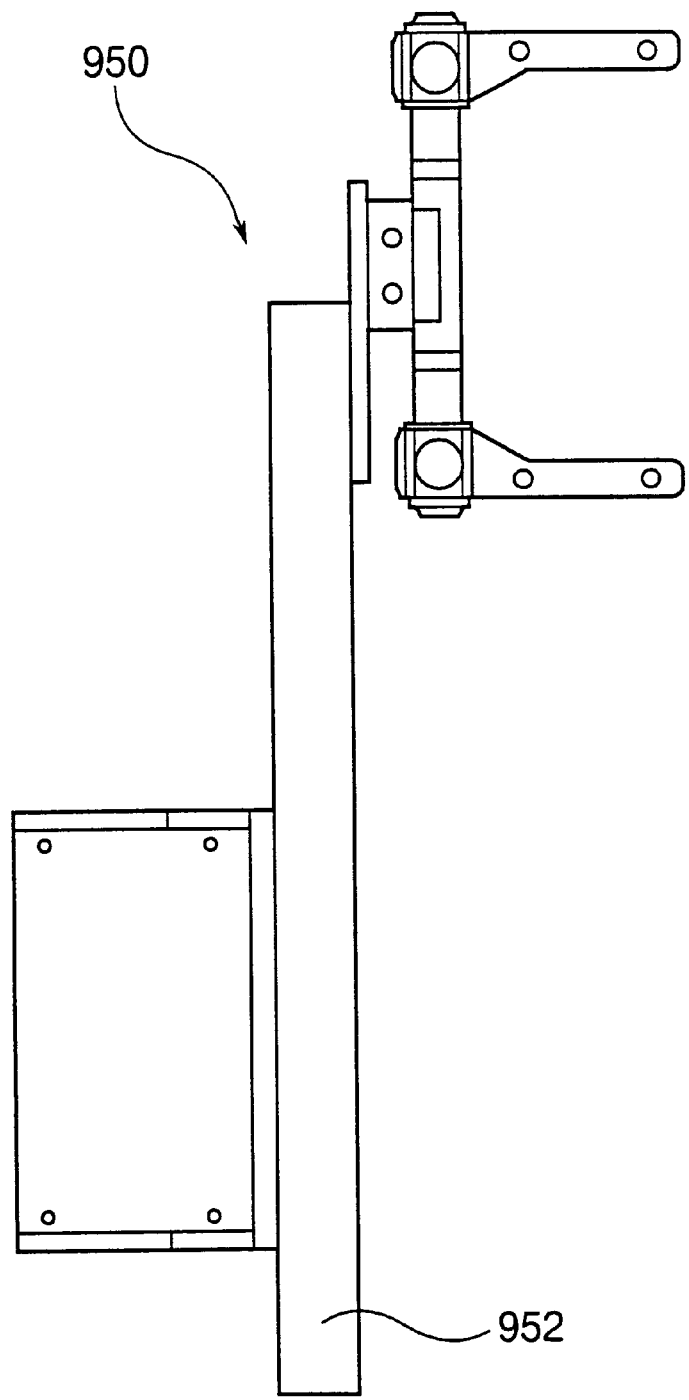
FIG. 24 is a top view of a carrying arm unit included in the wafer transfer apparatus of the present invention.
Figure 25:
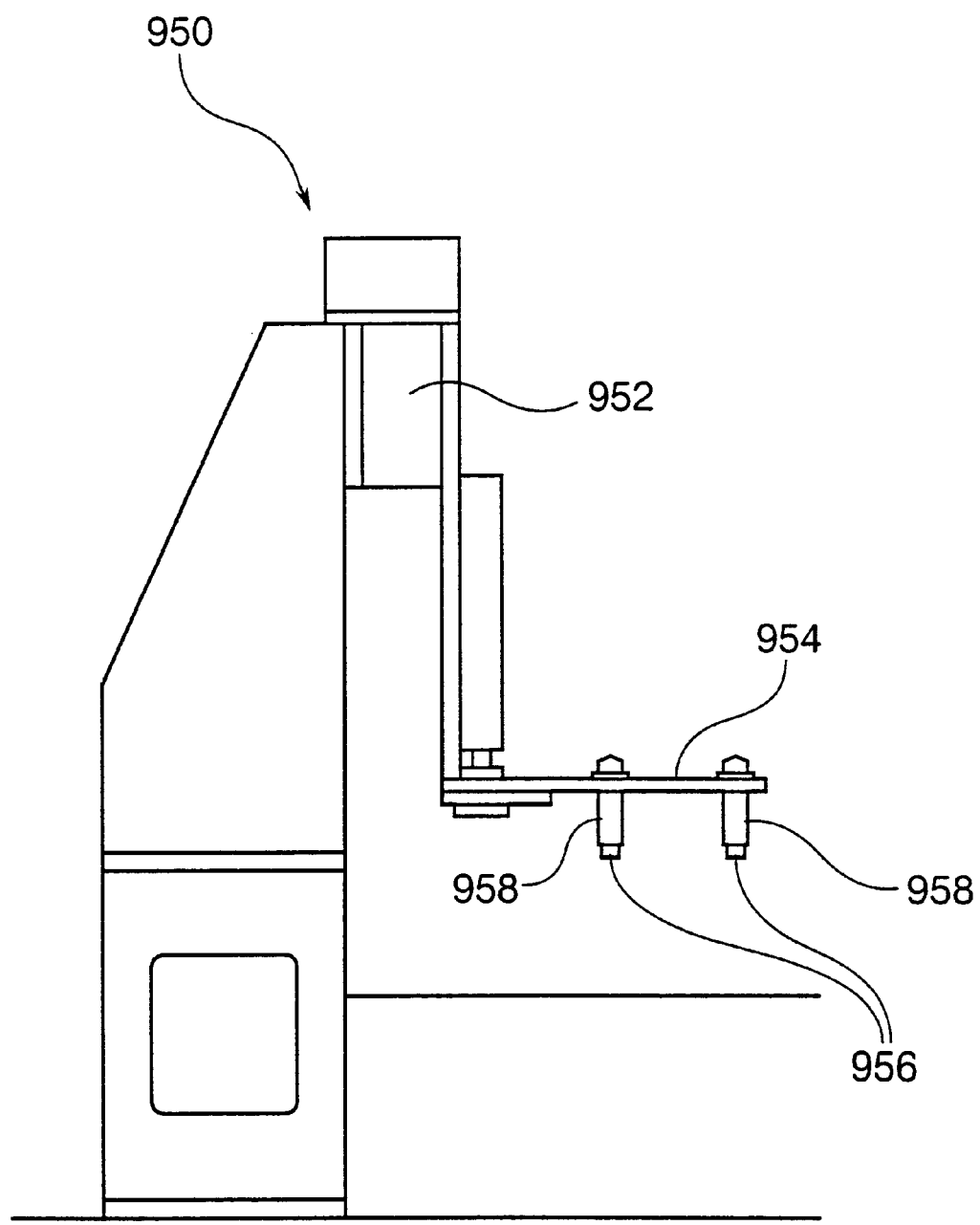
FIG. 25 is a side view of the carrying arm unit included in the wafer transfer apparatus of the present invention.

The carrying arm unit 950, referring to FIGS. 24 and 25, is fitted with carrying arm member 954 and this carrying arm member 954 can be moved in the cross direction on guide rail 952. This guide rail 952 is extended in the Y-axis direction from the table 812 of the protective tape peeling unit 800 to discharge roller part 902 of the discharge pusher unit 900. The carrying arm member 954 is fitted with suction pad member 956 and suction part 958 arranged in a location corresponding to the ring frame R.

Thus, with respect to the wafer W having the protective tape P peeled from the wafer surface by the protective tape peeling unit 800, the carrying arm member 954 of the carrying arm unit 950 is moved along the guide rail 952. Then, the ring frame R portion of the wafer W integrated with ring frame R, disposed on the table 812 of the protective tape peeling unit 800, is held by suction by means of the suction pad member 956 of the suction part 958. While this suction holding is maintained, the carrying arm member 954 is moved along the guide rail 952 so that the wafer W is moved and disposed on the discharge roller part 902 of the discharge pusher unit 900.

The discharge pusher unit 900, referring to FIG. 1, is fitted with a right and left pair of side guide members 902 fixed on the base 14 of the wafer transfer apparatus 10. Each of the internal surfaces of the pair of side guide members 902 is furnished with a roller part (not shown) composed of a plurality of rollers arranged at constant spacing. The ring frame R portion is brought into contact with the roller parts, so that the breakage caused by wafer to roller contacts can be avoided.

Moving cylinder 908 is arranged in the rear of the roller parts. The moving cylinder 908 can be slid in the cross direction under the guidance by means of guide rod 910. Pusher member (not shown) secured to an upper side of the moving cylinder 908 pushes the wafer W, which has been moved and disposed on the roller parts, toward the front side in accordance with the move of the moving cylinder 908. As a result, the wafer W is accommodated in accommodation cassette 1002 of unloader unit 1000 arranged on the front side.

The above unloader unit 1000 is so constructed as to be vertically movable so that the accommodation cassette 1002 can be located at a position corresponding to the height of the roller parts of the discharge pusher unit 900.

The present invention is never limited by the foregoing examples. Various modifications, for example, arranging the ultraviolet irradiation unit can be disposed downstream of the transfer tape mount unit.

It is also feasible to use a tape coated with an ultraviolet curable pressure sensitive adhesive as the transfer tape T and to arrange an ultraviolet irradiation unit similar to the ultraviolet irradiation unit 300, which irradiates the transfer tape T having been used to stick the wafer W to the ring frame R with ultraviolet, especially in front of or in the rear of the discharge pusher unit.

With the use of the wafer transfer apparatus of the present invention, a position adjustment is effected in longitudinal and lateral directions (XY-directions) and rotational direction (θ-direction) along chipped wafer division lines of the wafer W. Therefore, the wafer is located in a reference position, so that accurate die bonding in the die bonding step can be performed and chip breakage can be avoided. Moreover, the positioning operation, transfer operation and protective tape peeling operation can be continuously and automatically performed without the need to conduct carrying by means of carriers, so that wafer breakage, damaging and cracking can be avoided.

Furthermore, the present invention prevents local loading on the wafer by suction holding of the wafer at all the surface thereof to thereby enable effectively preventing wafer breakage and cracking.

What is claimed is:

1. A wafer transfer apparatus for sticking a wafer, which is divided into a multiplicity of chips and which has its surface stuck with a protective tape, to a ring frame by a transfer tape, comprising:
   a positioning unit for disposing the protective tape stuck wafer on a positioning table and configured to perform a position adjustment of the wafer in longitudinal, lateral and rotational directions, so that the wafer is located in a reference position;
   a transfer tape mount unit for disposing the protective tape stuck wafer, which has been located in the reference position by the positioning unit, on a transfer tape mount table, and configured to stick a transfer tape to both a ring frame disposed around a periphery of the wafer and a back of the wafer, so that the wafer and the ring frame are stuck to each other and integrated; and protective tape peeling unit for disposing the wafer, which has its back covered with the transfer tape and which has been integrated with the ring frame by the transfer tape mount unit, on a protective tape peeling table, and configured to bond an end of a peeling tape to an end of the protective tape stuck to the wafer surface, and configured to pull the peeling tape so that the protective tape is peeled from the wafer surface.

2. The wafer transfer apparatus as claimed in claim 1, which further comprises an accommodation unit fitted with a frame cassette for accommodating the wafer, which is integrated with the ring frame and which has the protective tape removed from the wafer surface by the protective tape peeling unit.

3. The wafer transfer apparatus as claimed in claim 1, wherein the peeling tape used in the protective tape peeling unit is a heat sensitive adhesive tape, and which apparatus is so constructed that an end of the peeling tape is bonded by heat melting to an end of the protective tape stuck to the wafer surface, and so that the peeling tape is pulled to thereby enable peeling of the protective tape from the wafer surface.

4. The wafer transfer apparatus as claimed in claim 1, which further comprises means for carrying the wafer between the individual units, said carrying means being so constructed as to carry the wafer while an entire area of surface of the wafer is attracted thereto by suction.

5. The wafer transfer apparatus as claimed in claim 1, wherein the transfer tape includes an ultraviolet curable pressure sensitive adhesive, and the apparatus further comprises an ultraviolet irradiating unit for irradiating the transfer tape with ultraviolet light after the wafer and the ring frame are stuck to each other by the transfer tape.

6. The wafer transfer apparatus as claimed in claim 5, which further comprises an accommodation unit fitted with a frame cassette for accommodating the wafer, which is integrated with the ring frame and which has the protective tape removed from the wafer surface by the protective tape peeling unit.

7. The wafer transfer apparatus as claimed in claim 1, wherein the protective tape includes an ultraviolet curable pressure sensitive adhesive, and the apparatus further comprises an ultraviolet irradiating unit for irradiating the protective tape with ultraviolet light prior to the peeling of the protective tape from the wafer surface by the protective tape peeling unit.

8. The wafer transfer apparatus as claimed in claim 7, which further comprises an accommodation unit fitted with a frame cassette for accommodating the wafer, which is integrated with the ring frame and which has the protective tape removed from the wafer surface by the protective tape peeling unit.

9. The wafer transfer apparatus as claimed in claim 7, wherein the ultraviolet irradiating unit is arranged so that the ultraviolet irridiation precedes the sticking of the transfer tape to the wafer.

10. The wafer transfer apparatus as claimed in claim 9, which further comprises an accommodation unit fitted with a frame cassette for accommodating the wafer, which is integrated with the ring frame and which has the protective tape removed from the wafer surface by the protective tape peeling unit.

* * * * *

UNITED STATES PATENT AND TRADEMARK OFFICE
CERTIFICATE OF CORRECTION

PATENT NO. : 6,238,515 B1
DATED : May 29, 2001
INVENTOR(S) : Masaki Tsujimoto et al.

It is certified that error appears in the above-identified patent and that said Letters Patent is hereby corrected as shown below:

Column 4,
Line 67, "The wafer W." should read -- The wafer W, --.

Signed and Sealed this

Eleventh Day of December, 2001

*Attest:*

NICHOLAS P. GODICI
*Attesting Officer*   *Acting Director of the United States Patent and Trademark Office*